US011598969B2

(12) United States Patent
Boriskin et al.

(10) Patent No.: US 11,598,969 B2
(45) Date of Patent: Mar. 7, 2023

(54) ADHESIVE-FREE BONDING OF DIELECTRIC MATERIALS, USING NANOJET MICROSTRUCTURES

(71) Applicant: Thomson Licensing, Cesson-Sevigne (FR)

(72) Inventors: Artem Boriskin, Cesson-Sevigne (FR); Ray Keating, Camarillo, CA (US); Justin Cunningham, Camarillo, CA (US)

(73) Assignee: Thomson Licensing, Cesson-Sevigne (FR)

( * ) Notice: Subject to any disclaimer, the term of this patent is extended or adjusted under 35 U.S.C. 154(b) by 441 days.

(21) Appl. No.: 16/642,396

(22) PCT Filed: Aug. 31, 2018

(86) PCT No.: PCT/EP2018/073540
§ 371 (c)(1),
(2) Date: Feb. 27, 2020

(87) PCT Pub. No.: WO2019/043197
PCT Pub. Date: Mar. 7, 2019

(65) Prior Publication Data
US 2020/0192107 A1 Jun. 18, 2020

(30) Foreign Application Priority Data
Sep. 1, 2017 (EP) .................................... 17306135

(51) Int. Cl.
G02B 27/09 (2006.01)
B82Y 20/00 (2011.01)
(52) U.S. Cl.
CPC .......... *G02B 27/0927* (2013.01); *B82Y 20/00* (2013.01); *G02B 2207/101* (2013.01)

(58) Field of Classification Search
CPC ................ G02B 27/0927; G02B 27/09; G02B 27/0955; G02B 2207/101; G02B 19/0009;
(Continued)

(56) References Cited

U.S. PATENT DOCUMENTS

| 4,636,609 A | * | 1/1987 | Nakamata | ........... B29C 66/1122 219/121.75 |
| 7,946,898 B2 | | 5/2011 | Fukuda et al. | |
| 2012/0266985 A1 | | 10/2012 | Momose et al. | |

FOREIGN PATENT DOCUMENTS

| WO | 2012081584 A1 | 6/2012 |
| WO | 2017162881 A1 | 9/2017 |
| WO | 2017162882 A1 | 9/2017 |

OTHER PUBLICATIONS

Marvin J. Weber, "Handbook of Laser Wavelengths", CRC Press (1999).
(Continued)

*Primary Examiner* — Jie Lei
(74) *Attorney, Agent, or Firm* — Vincent Edward Duffy

(57) ABSTRACT

A method of bonding layers of dielectric materials includes
providing a surface one of the layers with microscale- and/or nanoscale-size bonding elements forming contact points of the layers and
bringing a layer of the layers into a mutual position according to an intended use.
The method also includes illuminating the layer whose surface is provided with bonding elements by an incident electromagnetic wave, the propagation direction of which is substantially orthogonal to the one of the layers, and whose wavelength is selected depending on an absorption spectrum of a material forming the one of the layers and
generating condensed optical beams within said bonding elements or close to a tip of said bonding elements intended to be in contact with the other layer.

(Continued)

The method further includes heating and melting the bonding elements by high-intensity focal spots formed by said generated optical beams and maintaining the layers into a mutual position until and bonding of the layers.

15 Claims, 18 Drawing Sheets

(58) Field of Classification Search
CPC .. G02B 19/0014; B23K 26/00; B23K 26/032; B23K 26/26; B23K 26/21; B82Y 20/00; B82Y 30/00; B82Y 40/00; B81C 3/00; B81C 3/001; B81C 2203/037; B81C 1/00; B81C 1/00071
USPC ..... 359/618, 625, 540, 500, 586; 219/121.6, 219/121.61, 121.63, 121.66; 977/703, 977/767, 785
See application file for complete search history.

(56) References Cited

OTHER PUBLICATIONS

E.J.G. Peterman et al., "Laser-Induced Heating in Optical Traps", Biophysical Journal, vol. 84, pp. 1308-1316 (2003).
COVESTRO Deutschland AG, "Optical Properties of Makrolon and Apec for Non-Imaging Optics", (Jun. 2016).
G.D. Kipling et al., "A Considered Approach to Lab-on-a-Chip Fabrication", Chapter 4 in Lab-on-a Chip Devices and Micro-Total Analysis Systems: A Practical Guide (J. Castillo-Leon and W.E. Swenson, eds.), Springer International (2015).
K.N. Ken et al., "Soft-Lithography-Based High Temperature Molding Method to Fabricate Whole Teflon Microfluiditic Chips", 14th International Conference on Miniaturized Systems for Chemistry and Life Sciences, Oct. 3-7, 2010, Groningen, The Netherlands, pp. 554-556 (Oct. 3, 2010).

* cited by examiner

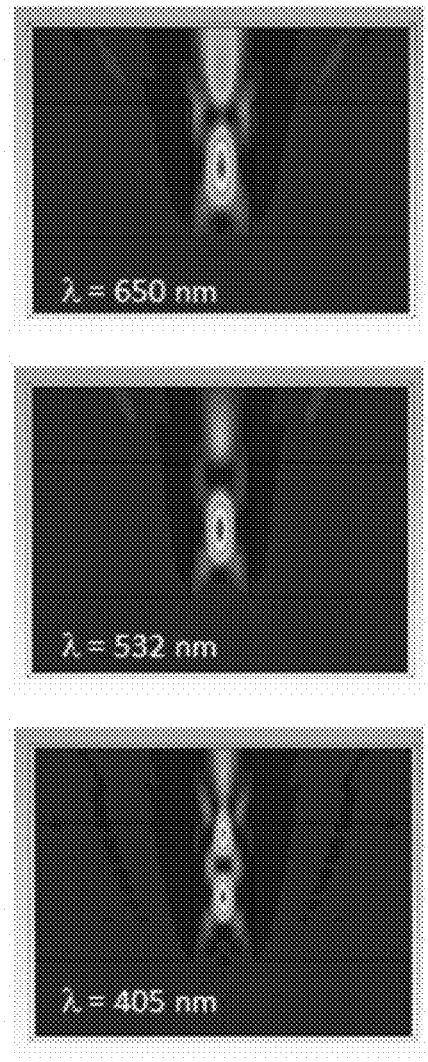 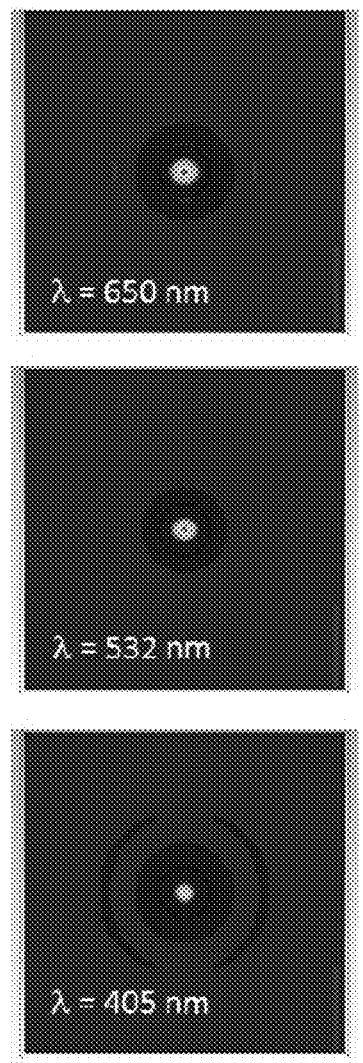
Fig. 13a                    Fig. 13b

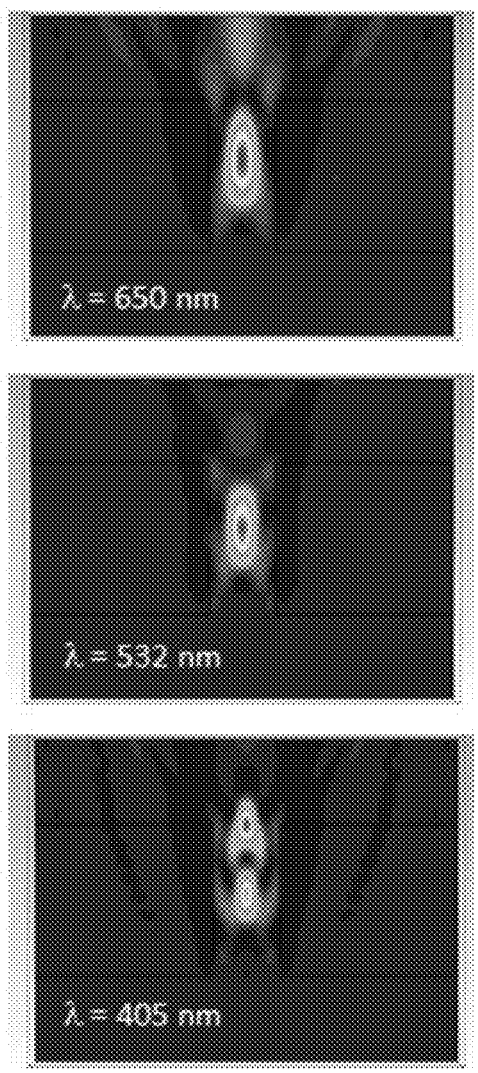 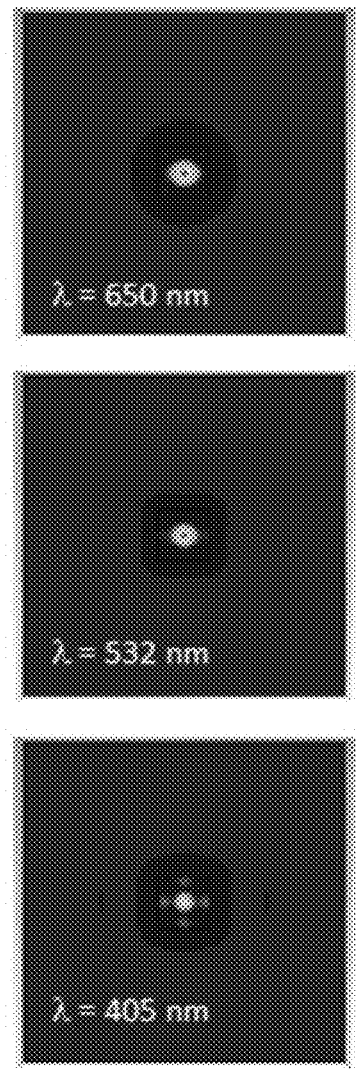
Fig. 14a                    Fig. 14b

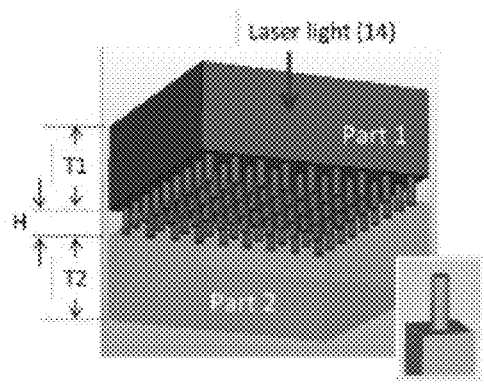 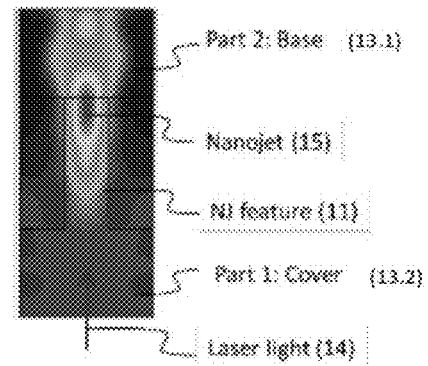
Fig. 24a    Fig. 24b
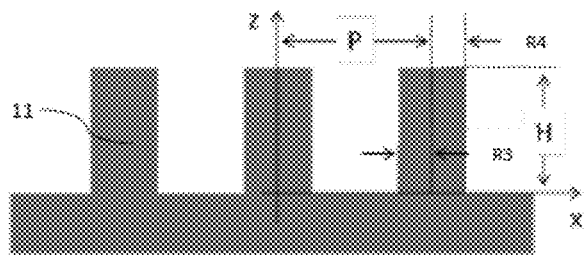
Fig. 24c
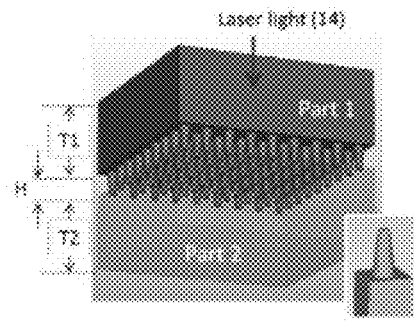 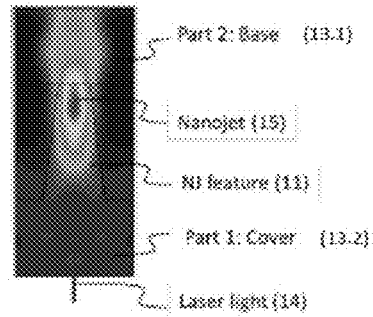
Fig. 25a    Fig. 25b
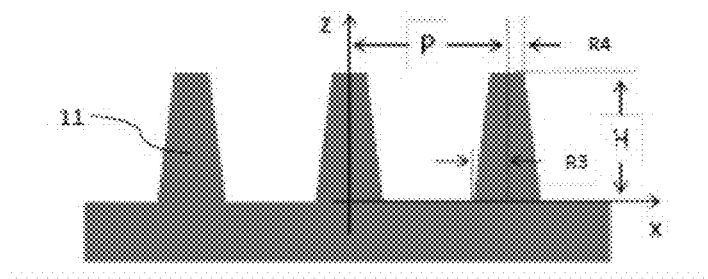
Fig. 25c

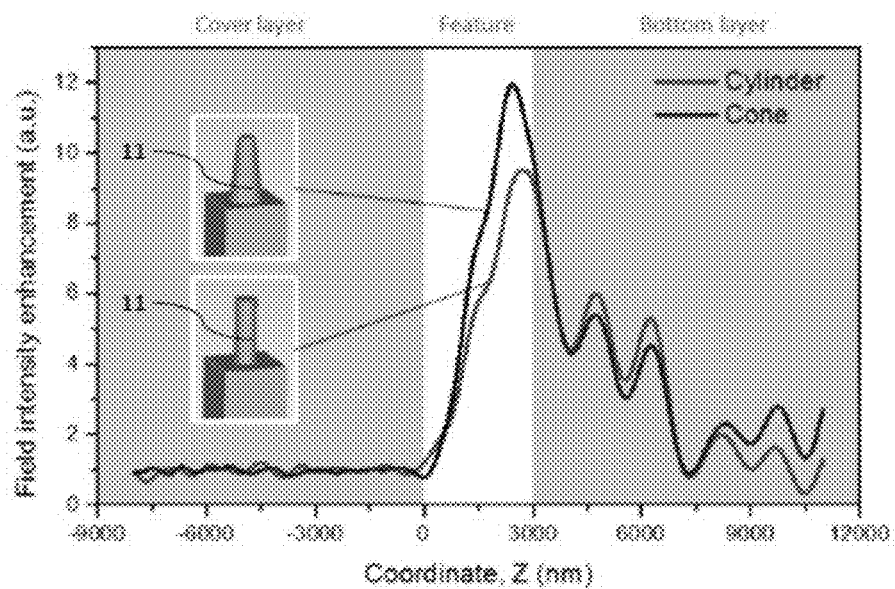
Fig. 26
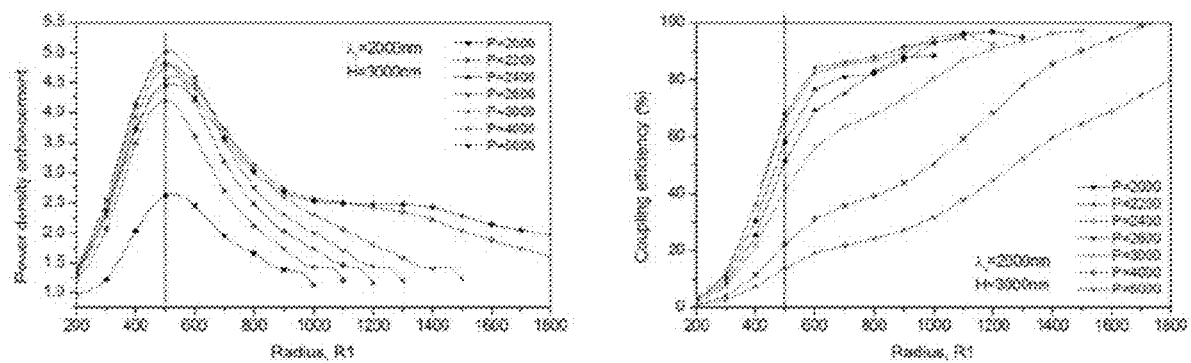
Fig. 27a
Fig. 27b

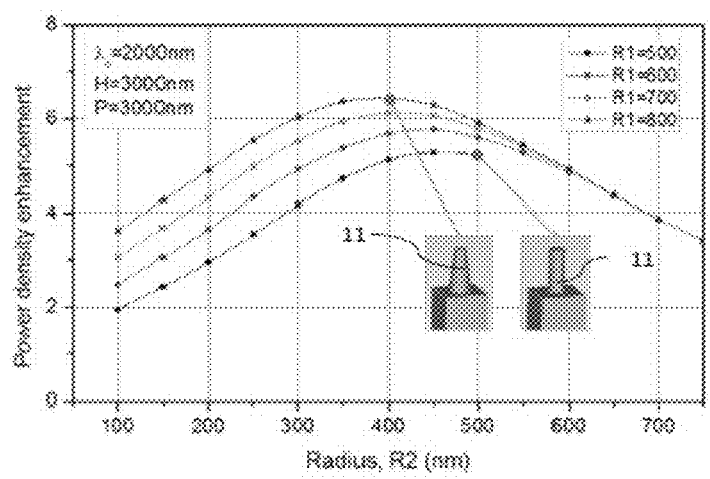
Fig. 28
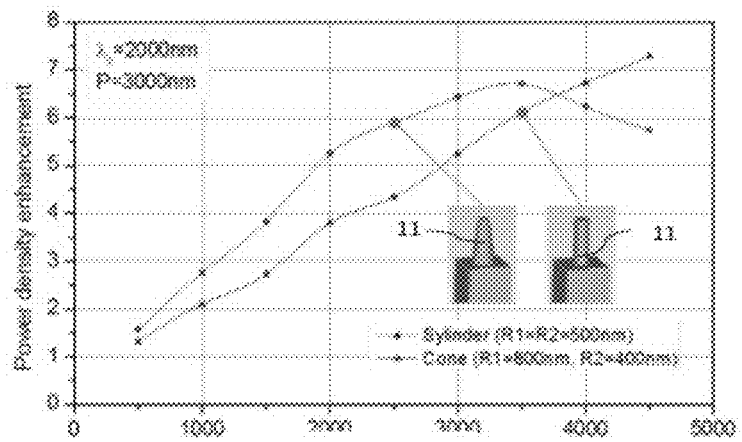
Fig. 29
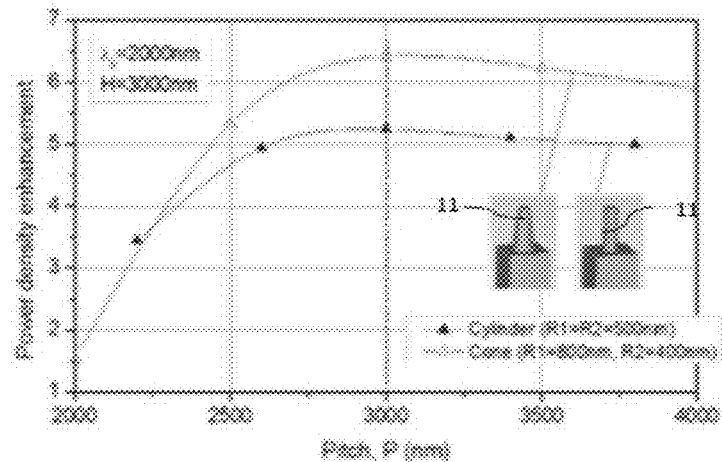
Fig, 30

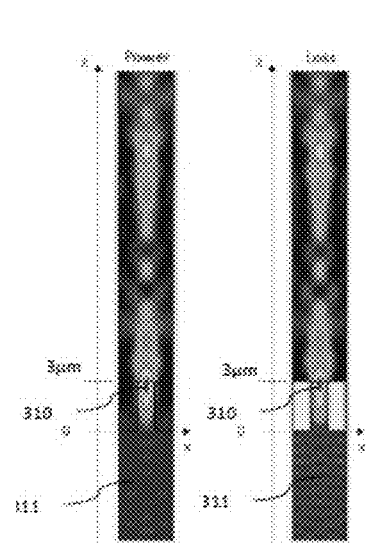 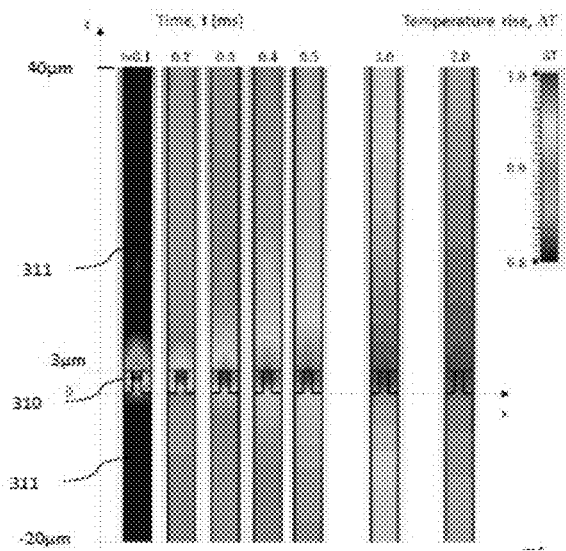
Fig. 31a                Fig. 31b
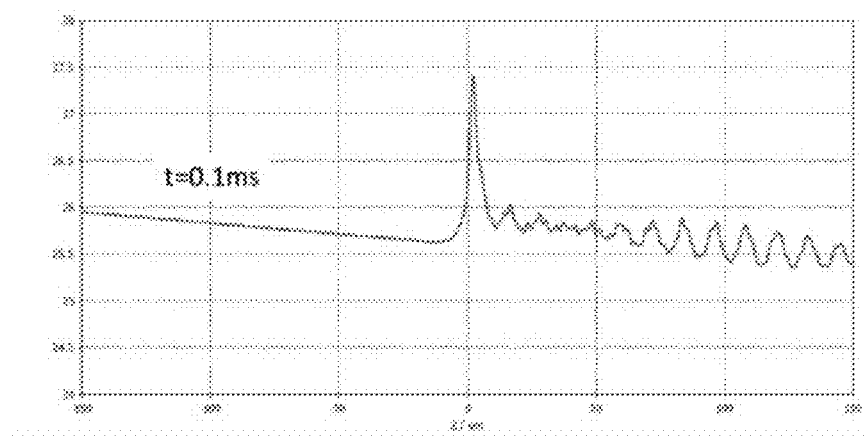
Fig. 32
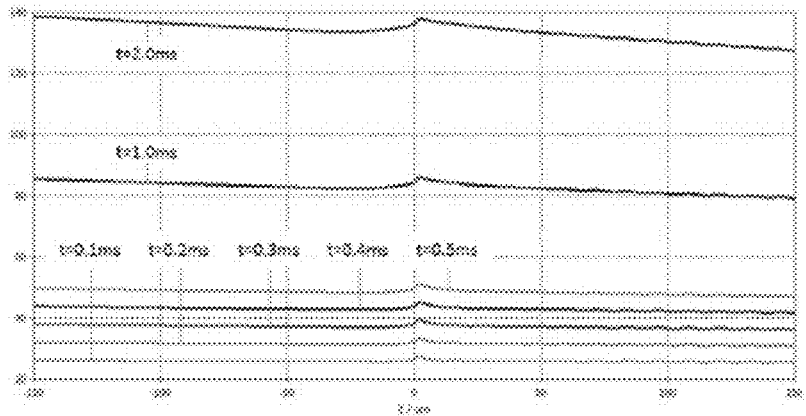
Fig. 33

ADHESIVE-FREE BONDING OF DIELECTRIC MATERIALS, USING NANOJET MICROSTRUCTURES

This application claims the benefit, under 35 U.S.C. § 365 of International Application PCT/EP2018/073540, filed Aug. 31, 2018, which was published in accordance with PCT Article 21(2) on Mar. 7, 2019, in English and which further claims the benefit of priority application EP17306135.9, filed on Sep. 1, 2017.

1. FIELD OF THE INVENTION

The present disclosure relates to a method for bonding two layers of materials together, which is adhesive-free. It is of particular interest for applications requiring welding together layers of materials having some surface areas that must be kept free from contaminants, though the present disclosure is not restricted to such applications.

2. BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

The adhesive-free sealing methods may be of interest for applications requiring welding together layers of a microfluidic chip that comprise a network of microfluidic channels engraved in one of the layers for transportation of fluids under the control of capillary forces. For such applications, it is critically important to provide hermetic sealing of the two layers to prevent leakage of the fluid and, at the same time, prevent any glue from getting into and blocking the micro-channels.

More generally, many practical applications require hermetic sealing of layers of similar or dissimilar materials (e.g. plastics, glass, ceramics, semiconductors, metals, etc.). Among those are display fabrication, OLED (for «Organic Light-Emitting Diode») packaging, touch screens, and solar cells encapsulation, etc., mostly based on the use of optically-transparent plastics and glasses.

The established sealing approach of using glue (of any type) is not always acceptable for these applications because the glue may enter into fine microstructures on the surface of the layers to be sealed together and/or change optical properties of the sandwiched structure. The microscopic dimensions of microfluidic channels (having typical size of about 20 to 100 microns) as well as dense spacing between neighboring channels make the sealing problem very challenging.

Alternative sealing methods have hence been investigated, which include laser, infrared and microwave heat sealing, as well as high-density plasma sealing.

However, for the time being, there remains a technological challenge associated with mass-production of multi-layer microfluidic (MF) chips.

An established approach, which is routinely used for microfluidic chips fabrication in laboratory conditions, is based on plasma sealing of molded polymer (e.g. PDMS, Polydimethylsiloxane) structures to glass substrates, as described by G. D. Kipling, et al. in "*A Considered Approach to Lab-on-a-Chip Fabrication*," Chapter 4 in Castillo-Leon, W. E. Svendsen (eds), *Lab-on-a-Chip Devices and Micro-Total Analysis Systems: A Practical Guide*, Springer 2015.

This approach results in a very strong hermetic sealing of the structure but is not suited for mass-production because of the complexity and poor endurance of organic polymers. Actually, the plasma sealing process is based on ion bombardment of the surface of the molded polymer, which induces structural and chemical changes of the material, both on the surface and on the sidewalls of the microchannels. These changes can extend into the bulk material and irreversibly change its properties. Moreover, oxidized surfaces should be brought into contact immediately after plasma treatment to achieve the strongest bond (since time is limited by the recombination time of the broken chemical links on the surface layer), which appears difficult for mass production.

This explains interest for developing new methods for MF chip fabrication using more practical materials, like plastics.

Other known heat sealing methods, whether based on use of a visible light or infrared laser or microwaves, can be associated with certain difficulties when a controlled heating of a very thin layer (order of a few microns thick) along a bonding line inside the material is required. Notably, such prior art methods cannot be directly applied to manufacturing microfluidic chips due to their small thickness and specific properties of the materials. Actually, each of these methods is only applicable for a certain type of materials and may not be suitable for sealing non-conductive optically-transparent dielectric materials, like plastics, which are widely used in the aforementioned applications.

In this context, it might be of particular interest to develop a method that would fit an existing fabrication process already used for another application, e.g. DVD fabrication.

More generally, it would be desirable to provide a method of bonding two layers of dielectric materials without adhesive (or with optional adhesive), which would overcome these drawbacks. Notably, it would be desirable to provide a new adhesive-free heat sealing method that would enable to overcome the difficulties associated with fabrication of multi-layer microfluidic chips as discussed above.

3. SUMMARY

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one aspect, a method of bonding two layers of dielectric materials is provided, comprising:
  providing a surface of at least one of said layers with microscale- and/or nanoscale-size bonding elements forming contact points of said layers;
  bringing said layers into a mutual position according to an intended use;
  illuminating said layer whose surface is provided with bonding elements by an incident electromagnetic wave, the propagation direction of which forms an angle comprised between 70° and 110° with said layer, and whose wavelength is selected depending on an absorption spectrum of a material forming said layer;

generating condensed optical beams within said bonding elements or close to a tip of said bonding elements intended to be in contact with the other layer;

heating and melting said bonding elements and/or said other layer by high-intensity focal spots formed by said generated optical beams;

keeping said layers into said mutual position until bonding of said layers.

The present disclosure thus presents a new application of the nanojet light focusing phenomenon. Actually, it enables one to achieve a high concentration of electromagnetic (EM) fields in a thin layer inside a multi-layer dielectric structure, said layer comprising a variety of nanoscale-size bonding elements, which size and shape are optimized with respect to the incident EM wave (e.g. laser beam). In such a way, the bonding elements can be heated and melted providing the bonding for sealing two layers of materials.

Such a method avoids the use of glue and thus prevents the risk of the glue occasionally getting in the microscopic channels engraved on the surface of the chip counterparts, when applied to manufacturing microfluidic chips.

Instead of using some glue, the present disclosure relies on the use of bonding elements on the surface of at least one of the materials to be sealed together. Such bonding elements can be heated in a controlled way and melted, providing, in such a way, a controlled amount of bonding delivered directly to the contact points of the two materials that need to be sealed one to another.

Unlike other heat sealing methods, the present method does not require any thermosoftening glue, resin, or another adhesive material to be added. Instead, it relies on the controlled highly-localized heating of a superficial layer of the bulk material. This offers a strong advantage in scenarios when the materials that need to be sealed together already have some microscale surface patterns, which must be kept clean from any impurities, like a microfluidic chip.

The two layers of dielectric materials must be aligned, according to the intended use, so as to place the bonding elements at the right contact positions. At the time of bonding, the two layers are placed into direct contact and submitted to a light pressure. By light pressure, it is meant here a pressure that induces no shape deformation of the layers, so that there is no mechanical stress from inside the sealed structure when the pressure is off.

When illuminated by an incident EM wave (e.g. laser beam), each bonding element acts as a focusing device, i.e. microlens, whose focal length is determined by the bonding element dimensions and refraction index of the material. For bonding elements of a certain size and shape, the nanojet focusing phenomenon leads to formation of a focal spot inside the bonding elements (or at the contact point between the bonding elements and the other layer of material) enabling highly-localized heating and, under certain conditions, melting of the bonding elements. After cooling, a strong bond is created along the contact line. For other bonding elements, the nanojet focusing phenomenon leads to formation of a focal spot close to, but above, the tip of the bonding elements, preferably inside the layer which does not bear the bonding elements.

Such a method can be used to provide superior welding of virtually all thermoplastic materials.

A typical exemplary size of bonding elements is circa 1 to 5 microns.

According to an embodiment of the present disclosure, the laser source used for welding is operating in the near-IR range. In particular, a wavelength near 2 μm is a good choice because most of the plastic materials are semi-transparent at this wavelength.

According to an embodiment of the present disclosure, a pulsed laser is used to provide a sufficient power to melt the bonding elements during a period of time, which is short enough to prevent the heat transfer from the weld area at the interface between the two layers. The pulse duration may vary in the range of 0.01 to a few milliseconds.

According to another embodiment, a continuous wave (CW) laser source is used with a continuous or gated (modulated) output.

According to an embodiment of the present disclosure, the laser spot size does not match precisely the size of the Nanojet (NJ) texture. The spot can be larger than the texture, whereas the parameters of the welding process (power, pulse duration, welding speed, etc.) are selected in a way to provide the melting conditions only within the NJ texture area. In such a way, the weld seam width is also limited by the dimensions of the NJ texture.

The proposed NJ-assisted laser welding method can be used to laser weld virtually all thermoplastic materials, subject for an appropriate value of the absorption coefficient of the material at the laser wavelength and thickness of the cover.

According to an embodiment of the present disclosure, the bonding elements form a patterned microstructure on the surface of the layer.

Such a patterned microstructure defines the pattern features of the contact points between the two layers, and ensures the appropriate bonding. It allows for precise control over the location of bonding (appearing after melting of the bonding elements).

According to an embodiment of the present disclosure, the bonding elements have a form of pillars and/or ribs.

In particular, the bonding elements may have a form of:
cylindrical or conical pillars with circular, oval/elliptic, rectangular, pentagons, hexagons, octagons, etc. cross-section,
pillars with cross-type cross-section,
pillars as above with a hollow core,
ribs with a straight or curvilinear edge and/or symmetrical or non-symmetrical cross-section in a cut plane orthogonal to the longer side of the rib.
pillars and ribs as above with a lateral wall having two or more steps.

Hence, each element of the patterned surface may take the form of a pillar or of a rib, which size, spacing and shape defines the focusing ability of each bonding element and heat transfer conditions. A feature with a larger cross-section is capable of collecting more light and generating nanojets with higher peak intensity. This allows for faster heating in the vicinity of the nanojet, whereas the overall heating dynamics in a given volume is determined by the shape and size of the feature as well as by the NJ hot spot position. In other words, a larger size pillar will cause faster heating inside the pillar, however, the external surface will remain colder than that of a smaller pillar. Thus, the optimal topology of the bonding element is to be found as a trade-off between its EM focusing ability and heating dynamics in a given volume that comprises the bonding element and its surrounding.

The shape of the pillars can be selected rather arbitrarily. For instance, they may have a shape of a cylinder or prism with a circular or rectangular cross-section. Other shapes are also possible including a rib-type pillar that will act as a two-dimensional (2D) nanojet microlens. In an embodiment, the pillars have a conical shape (e.g. a truncated cone). Advantage of a conical shape is that it can collect more incident light due to a larger base and provides a faster melting of the tip due to its smaller volume.

According to an embodiment of the present disclosure, a dimension of the bonding elements in the direction of the incident electromagnetic wave is targeted to be between half a wavelength of the incident electromagnetic wave and a few wavelengths of the incident electromagnetic wave in the host medium.

In a preferred embodiment, such a dimension is between one and two wavelengths of the incident electromagnetic wave, which provides an optimal size for heating and melting. In particular, the preferred height-to-width aspect ratio is in the range of 2:1 to 5:1 for a cylindrical pillar and slightly less for a conical one. For the latter, it may vary from 1:1 to 5:1 depending on the cone base (slant) angle varying in the range of 60 to 90 degree, respectively. The optical phenomenon will of course occur for a wider range of pillar dimensions, so that melting of a larger pillar may also be achieved with appropriate illumination conditions in terms of laser impulse shape, intensity and duration.

According to an embodiment of the present disclosure, the layers are made of the same material. In particular, it can be used for sealing two layers of polycarbonate.

The process may also join certain dissimilar materials, such as different plastics, glass, etc.

According to an embodiment of the present disclosure, a material of the layer which surface is provided with bonding elements belongs to the group comprising plastics and thermoplastics.

It may be for example a polymer material such as PC (Polycarbonate), COC (Cyclic olefin copolymer), PMMA (Poly(methyl methacrylate)), PP (Poly propylene), PE (Polyethylene) or polytetrafluoroethylene (Teflon PTFE).

According to an embodiment of the present disclosure, a material of the layer which surface is provided with bonding elements comprises absorptive dyes or pigments (e.g. of a photochromic-type or carbon black).

An absorptive additive to the bulk material may help further localize the heating process by increasing efficiency of the EM to thermal energy conversion directly in the focal spot of the nanojet microlens.

According to an embodiment of the present disclosure, it also comprises providing a surface of at least one of said layers with engraved embossed, cast, ablated or molded microfluidic channels.

According to an embodiment of the present disclosure, bringing said layers into a mutual position according to an intended use is performed after heating and melting said bonding members.

This is of particular interest when both layers are made of a lossy (non-transparent) material. For instance, it may be polycarbonate at a wavelength below 300 nm. In such a case, it may be interesting to have a first layer illuminated by a laser beam from above directly on the patterned surface until pillars are melted. Then, the second layer is to be placed on top of the first layer and pressed down.

According to an embodiment of the present disclosure, when bringing said layers into a mutual position according to an intended use, said layers are placed into direct contact between two optically transparent plates. This may help applying a light pressure on the layers.

According to an embodiment of the present disclosure, it also comprises cooling down a surface of the layer opposite to the surface provided with the bonding elements.

This can be done either by air-cooling (i.e. ventilation) or by a contact cooling (i.e. placing the layer in contact with a glass substrate), in order to prevent premature melting of the layer. This may be of particular interest for a thick layer.

According to an embodiment of the present disclosure, it also comprises pre-heating at least the surface provided with the bonding elements. This may help achieve the temperature melting point of some materials forming the bonding elements using a lower power laser source.

According to an embodiment of the present disclosure, providing a surface of at least one of said layers with microscale- and/or nanoscale-size bonding elements is performed by molding or wet embossing said surface, which are known techniques already used in mass production.

According to an embodiment of the present disclosure, said bonding elements have a conical shape, their dimensions are selected so that the condensed optical beams are generated close to but above the tip of said bonding elements intended to be in contact with the other layer, and said layer whose surface is provided with bonding elements is made of a material which has lower losses than a material of the other layer. Alternately or additionally, the layer whose surface is provided with bonding elements is made of a material whose melting temperature is higher than that of the material of the other layer.

Such an embodiment provides a threefold advantage, namely:
  a simple fabrication of the bonding elements, thanks to their conical shape (absence of sharp edges and vertical slopes);
  uniform heating of the bonding elements having a sharp tip, thanks to their conical shape;
  enhanced mechanical rigidity of the sealed structure, thanks to a penetration of the bonding elements in the other layer.

4. BRIEF DESCRIPTION OF THE DRAWINGS

The present disclosure can be better understood with reference to the following description and drawings, given by way of example and not limiting the scope of protection, and in which:

FIG. 1 provides a schematic illustration of the method according to an embodiment of the present disclosure, in the specific context of a microfluidic chip;

FIG. 2 describes the main steps of the process of bonding layers according to an embodiment of the present disclosure;

FIG. 3 is a schematic drawing for light propagation inside the structure shown in FIG. 1A-1C;

FIG. 4 provides curves showing the critical thickness of a layer to be bonded according to embodiments of the present disclosure as a function of the intensity magnification number M for different values of the absorption coefficient α of the bulk material forming the layer;

FIG. 5 presents the reflection factor P and reflection loss $L_r=(1-P)*100\%$ as a function of the bulk material refractive index;

FIG. 6 presents the absorption coefficient α and critical thickness $T_c$ of a dielectric plate as a function of the bulk material transmittance τ;

FIG. 7 provides a schematic illustration for the laser heating process according to embodiments of the present disclosure inside a pillar;

FIG. 8 provides some notations for a multi-layer structure used in the method according to embodiments of the present disclosure;

FIGS. 9A and 9B show a CAD model of a circular and rectangular pillar in between two semi-infinite dielectric plates representing a unit cell of a periodic structure according to embodiments of the present disclosure;

FIGS. 10A and 10B report the field intensity magnification number corresponding to the first field intensity maximum inside the pillar represented as a function of the pillar size;

Figure 16:
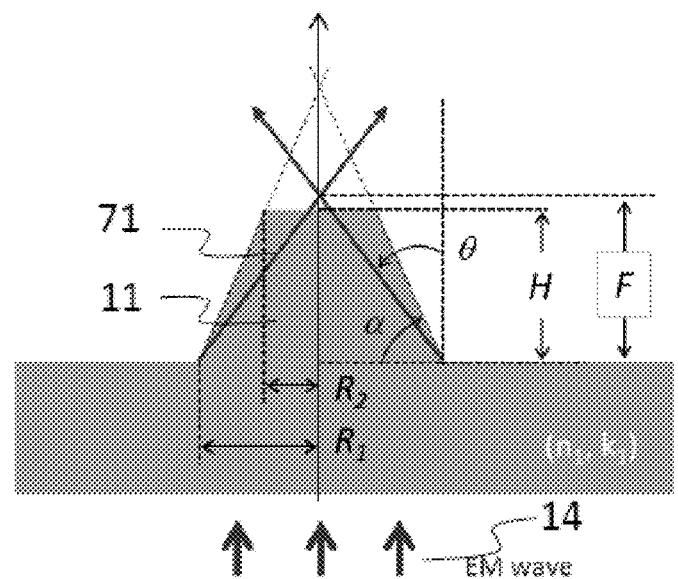
Figure 17:
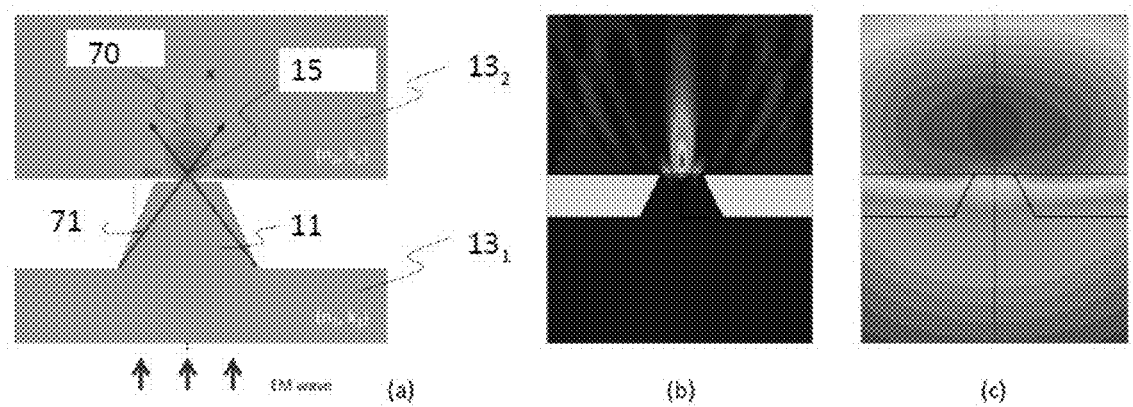

FIGS. 13A and 13B present the normalized field intensity patterns inside the structure with a circular pillar illuminated by a plane wave from below, respectively in xz-plane (FIG. 13A), and in xy-plane (FIG. 13B);

FIGS. 14A and 14B present the normalized field intensity profiles inside the structure with a rectangular pillar illuminated by a plane wave from below, respectively in xz-plane (FIG. 14A), and in xy-plane, z=1000 nm (FIG. 14B);

FIG. 15A to 15F illustrate possible embodiments of the multi-layer structure used in the method according to embodiments of the present disclosure;

FIG. 16 illustrates the geometry and notations of a conical pillar on a surface of a dielectric substrate, according to an alternate embodiment of the present disclosure;

FIG. 17 (a) provides a schematic drawing of the EM wave focusing and local heating phenomena in the structure of FIG. 16 illuminated by an EM wave from below; Hg. 17 (b) illustrates the power loss density distribution for the same structure illuminated by a plane wave from below;

FIG. 17 (c) provides a heat map inside the structure at a certain time moment;

FIG. 18 provides a schematic drawing of a microfluidic chip comprising two layers that are to be sealed one to another, according to the alternate embodiment of FIGS. 16 and 17: (a) top view of an exemplary microfluidic structure comprising two cavities connected with a narrow microchannel, (b) vertical cross-section view of the structure;

FIGS. 19 to 23 report simulated data describing the impact of the pillar shape and material losses on the focusing ability of the pillars and the temperature patterns inside the structure, according to the alternate embodiment of FIG. 16-18.

FIGS. 24 to 33 report simulated data describing the impact of the pillar shape on the focusing ability of the pillars and the temperature patterns inside the structure, according to alternate embodiment of FIGS. 24 and 25.

The components in the figures are not necessarily to scale, emphasis instead being placed upon illustrating the principles of the invention.

5. DETAILED DESCRIPTION

The general principle of the present disclosure relies on the electromagnetic (EM) heating of dielectric materials, as well as on the so-called Nanojet (NJ) focusing phenomenon, which provides control over the EM field intensity distribution inside the materials. More specifically, the NJ phenomenon enables highly-localized heating and melting of microstructure elements distributed in a controlled manner along the bond line on the interface of two materials.

Throughout the below text, the bonding elements are described as nanoscale-size bonding elements. It must be noted that this also encompasses microscale-size bonding elements, bearing in mind that, in some embodiments, a typical size of bonding elements is circa 1 to 5 microns (i.e. 1000 to 5000 nm).

5.1 First Embodiment and General Features

Figure 1A:
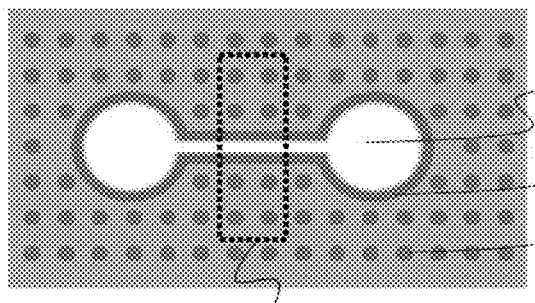
Figure 1B:
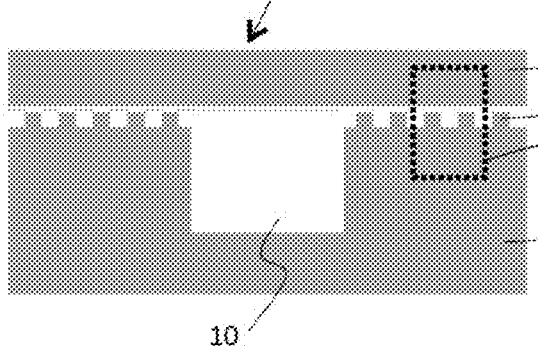
Figure 1C:
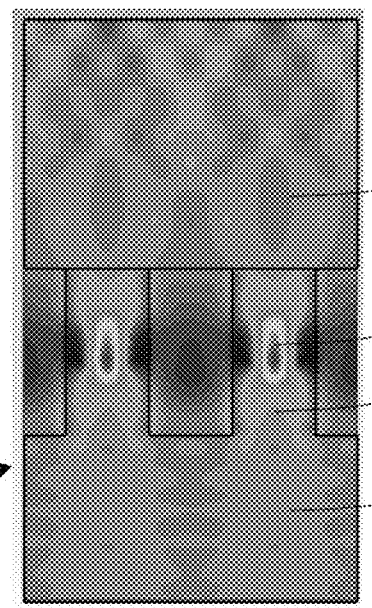

FIG. 1 provides a schematic illustration of the method according to an embodiment of the present disclosure, in the specific context of a microfluidic chip. More precisely, FIG. 1A provides a top view of a microfluidic structure comprising one microfluidic channel 10 and a plurality of pillars in a form of circular cylinders 11 and ribs 12 created on a surface of a layer $13_1$. FIG. 1B shows a side view of the structure corresponding to a cross-section highlighted by a dashed line on FIG. 1A. FIG. 1C shows the normalized field intensity distribution inside the structure when illuminated by a laser beam 14 from below. As may be observed, the nanojet focusing phenomenon enables creating hot spots 15 inside the pillars 11, which provide highly-localized heating and melting of the pillars 11.

Figure 2:
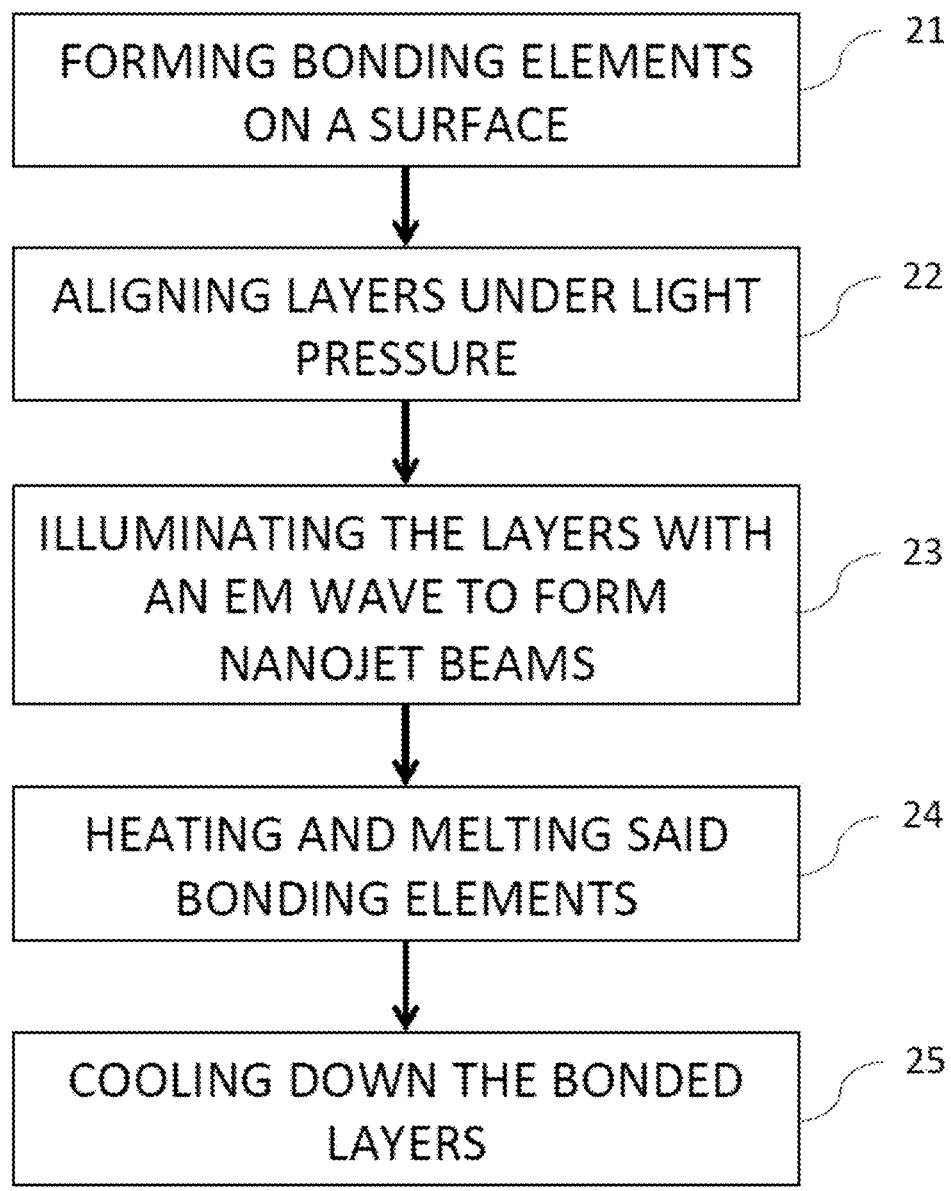

FIG. 2 describes the main steps of the process of bonding layers according to an embodiment of the present disclosure.

First, at step 21, a first layer $13_1$ of material is provided with nanoscale-size bonding elements, which may take the form of ribs 12 or pillars 11. In the embodiment of FIG. 1B, it is the upper surface of layer $13_1$ which includes a plurality of pillars 11 of different size and shape and additional features, such as a network of microfluidic channels 10. The manufacturing method of this patterned microstructure may be, for instance, molding or wet embossing.

A second layer $13_2$ is also manufactured, which may be a thin layer of a material similar (or dissimilar) to the one used for layer $13_1$.

This first layer $13_1$ and a second layer $13_2$ to which it must be bonded, are brought into a mutual position, according to an intended use, at step 22. For example, layers $13_1$ and $13_2$ are put in direct contact one to another and their outer lines are aligned.

The two layers of material are joined under light pressure, for example between two optically-transparent plates (e.g. made of glass). At step 23, they are then exposed with a laser beam 14 from below, as illustrated on FIGS. 1C and 3A, at a given wavelength, intensity and pulse duration necessary to heat and melt the pillars. The laser wavelength is to be selected depending on the absorption spectrum of the material. The higher the absorption, the better the efficiency of the transfer between the electromagnetic wave and thermal energy. However, for lossy materials (with low optical transparency) the propagation loss in the bulk material may be prohibitory large causing most of the EM energy dissipating before reaching the microstructure. Thus, the optimal thickness of the layer 1 will be a function of (i) the bulk material physical (e.g. complex refractive index) and thermal (e.g. thermal conductivity) parameters and (ii) focusing ability of the microscopic features on the upper surface of layer $13_1$ acting as NJ microlenses.

The formation of nanojet beams inside or at the tip of the pillars 11 causes heating and melting of the bonding elements 11, 12 at step 24. (It must be noted that, in the alternate embodiment described in Section 5.2, the formation of nanojet beams above the tip of the pillars 11 causes heating and melting of the second layer $13_2$ at step 24, rather than that of the bonding elements 11, 12).

The structure is then left under pressure until it cools down (step 25).

As will be apparent later on in this document, FIG. 2 describes a possible embodiment of the method according to the present disclosure. According to other embodiments, some additional steps may be required, depending notably on the selected fabrication methods and properties of the materials. The order of the steps may also change.

Figure 3A:
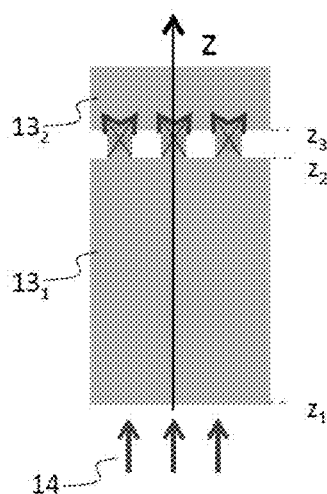
Figure 3B:
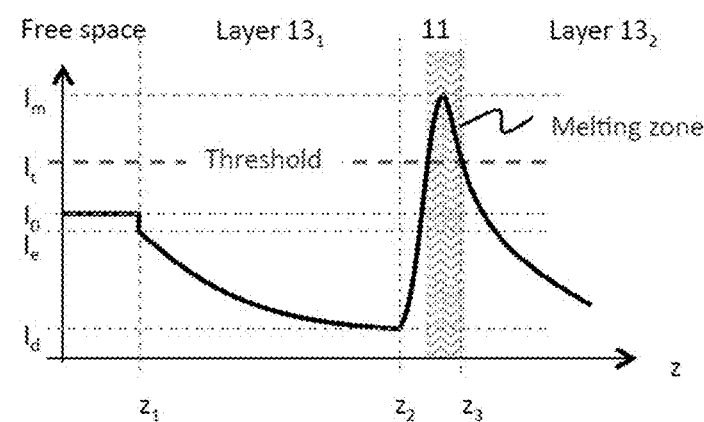

FIG. 3 is a schematic drawing for light propagation inside the structure shown in FIG. 1A-1C. FIG. 3A provides the model and notations which will be used throughout this document, while FIG. 3B shows the typical intensity profile of the EM wave along the z-axis inside the structure of FIG. 1A-1C.

5.1.1 Electromagnetic (EM) Model

We now describe the electromagnetic model sustaining the method according to embodiments of the present disclosure, when no heat transfer effects are taken in to account.

Let us assume that a light beam 14 with intensity $I_0$ propagating in the positive z-direction is incident on a stack of two layers $13_1$ and $13_2$ of a material from below, as shown in FIG. 3A. A typical power density distribution inside such a structure is shown in FIG. 3B. The variation of the intensity value along z-axis is explained by: (i) reflection loss at $z=z_1$ due to the reflection at the air/dielectric boundary, (ii) dissipation of EM energy along the propagation path inside the bulk material $z \in (z_1, z_2)$, and (iii) local increase of the field intensity inside the pillar 11 $z \in (z_1, z_3)$, which occurs due to the NJ focusing effect. Basic formulas describing decay of the light beam intensity inside the structure are provided below.

Intensity of the light beam penetrating inside the plate at $z=z_1$:

$$I_e = I_0(1-r) \qquad (1)$$

where $I_0$ is the intensity of the incident light beam, r is the reflectivity of the plate bulk material, which can be derived from Fresnel's formula as a function of the material refractive index n:

$$r = \left[\frac{n-1}{n+1}\right]^2 \qquad (2)$$

The intensity of the light beam at the upper surface of layer $13_1$ ($z=z_2$) is defined as:

$$I_d = I_e \exp(-\alpha T) \qquad (3)$$

where $T = z_2 - z_1$ is the thickness of layer $13_1$ and $\alpha$ is the absorption (or attenuation) coefficient defined as:

$$\alpha = \frac{4\pi k}{\lambda_0} \text{ typically defined in } [cm^{-1}] \qquad (4)$$

where k is the extinction coefficient being the imaginary part of the complex refractive index of the bulk material:

$$n^* = n + ik \qquad (5)$$

The rapid increase of the field intensity inside the pillar 11 is explained by the NJ focusing effect illustrated in FIG. 1C. For simplicity, the focusing ability of the NJ lens can be characterized using an intensity magnification number M, defined as a ratio of the field intensity at the bottom of the pillar 11 ($z=z_2$) and peak intensity inside the pillar 11:

$$I_m = M \cdot I_d = M \cdot I_e \exp(\alpha T) \qquad (6)$$

where M is the NJ lens intensity magnification number.

Note that the light beam propagating inside the pillar 11 experiences the same exponential decay of the EM wave intensity as in layer $13_1$, which is compensated (and exceeded) by the field intensity increase due to the NJ lens focusing phenomenon (here we assume that bulk material is linear and thus its absorption coefficient does not depend on the field intensity). However, a part of the EM energy dissipates inside the pillar 11 (mostly near its focal spot region) and transforms into the thermal energy, resulting in a local heating and finally melting of the pillar 11 provided the incident beam intensity and exposure time are sufficient to heat the pillar up to the melting temperature.

Figure 4:
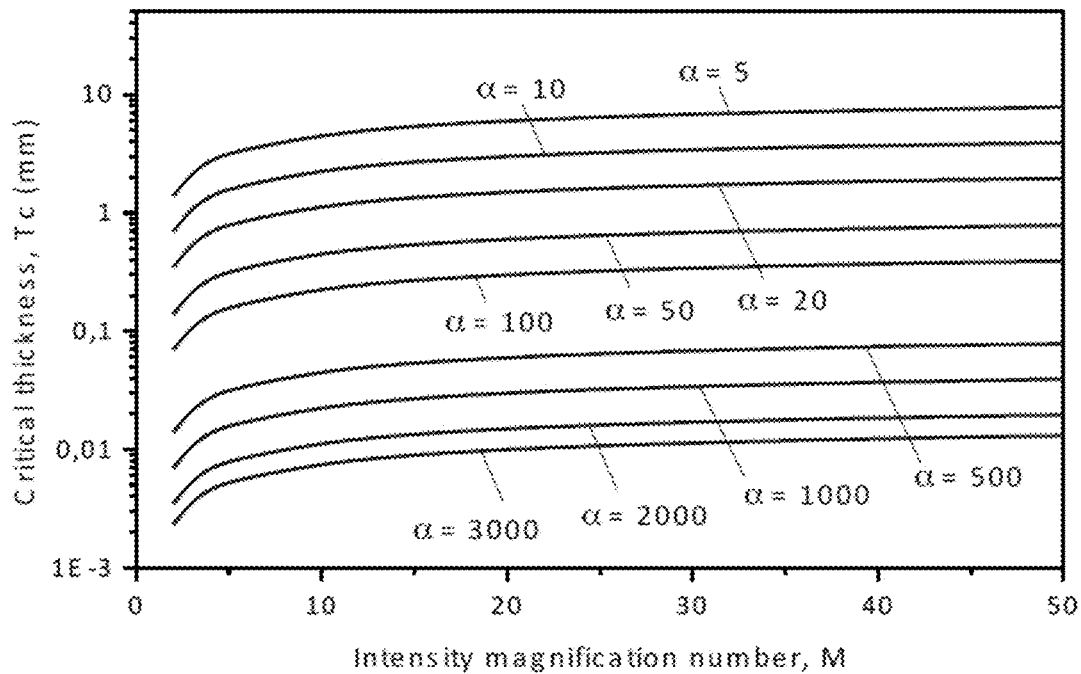

From the electromagnetic point of view, the feasibility conditions for the method according to embodiments of the present disclosure can be formulated as:

$$I_e < I_c \le I_m \qquad (7)$$

where $I_c$ is the critical beam intensity, i.e. the minimum intensity required to melt the bulk material. This condition is to be read as (i) the incident beam intensity must be lower than critical in order to prevent melting of the bulk material at the bottom surface of layer $13_1$ at $z=z_1$ and (ii) the NJ lens focusing ability must be high enough to enable melting of the material near the NJ lens focal spot area. Referring to Eqns. (1-6), the feasibility condition given by Eqn. (7) can be written as $$M \cdot \exp(\alpha T) > 1 \qquad (8)$$

which enables one to determine a critical thickness of layer 1:

$$T_c = -\frac{1}{\alpha} \cdot \ln\ln\frac{1}{M} \qquad (9)$$

where $T_c$ is the maximum allowed thickness of layer 1 corresponding to the condition $I_e = I_c = I_m$. For fixed values of $\alpha$ and M, a thicker layer will result in premature melting of the material at the bottom surface of layer $13_1$. Reference data for $T_c = T_c(M, \alpha)$ is presented in FIG. 4, which provides curves showing the critical thickness $T_c$ of layer $13_1$ expressed in millimeters {log-scale} as a function of the intensity magnification number M for different values of the absorption coefficient $\alpha$ of the bulk material forming layer $13_1$, whose values are provided for each curve in $[cm^{-1}]$. Note that this analysis does not take into account the heat transfer effects that may affect the EM to thermal energy conversion at the bottom surface and inside the pillars thus altering $T_c$ value (see section 5.3 for more details).

As follows from Eqn. (9), the critical thickness is to be determined for each material and NJ lens focusing ability. The latter is represented using the NJ lens intensity magnification number M, which depends on the lens shape and dimensions. As explained in patent application PCT/EP17/057130 (not yet published at the time of filing the present application), its typical value is varied in between 5 and 50 (see Section 5.4 for more details).

The material absorption coefficient $\alpha$ can be determined either (i) analytically using Eqn. 4, provided the extinction coefficient (or more generally complex refractive index) of the bulk material is known, or (ii) from the transmittance of the bulk material provided by the manufacturer or measured using a spectrophotometer, as described for example by B. Neuroth, in "*The optical properties of optical glass*", Springer, 1995, pp 82-83. The latter definition is based on the ratio between the light intensity of the beam incident on the plate and that of the beam transmitted through the plate (in this definition, the plate has a form of a planar dielectric layer of a given thickness d):

$$\tau = \frac{I_t}{I_0} = \frac{I_0(1-r)^2 \exp(-\alpha d)}{I_0} = P\tau_i \quad (10)$$

where $\tau$ is transmittance of a dielectric plate of a given thickness d, $I_0$ and $I_t$ are intensities of the incident transmitted light beam, $\tau_i = I_d/I_e$ is internal transmittance describing the propagation loss inside the plate, and P is the reflection factor describing reflection loss on both air/dielectric boundaries (including possible multiple internal reflections):

$$P \approx \frac{(1-r)^2}{1-r^2} = \frac{2n}{1+n^2} \text{[dimensionless]} \quad (11)$$

Knowing material refractive index and transmittance of the bulk material (usually provided by manufacturer—e.g. see Ref. COVESTRO Deutschland AG, "*Optical properties of Makrolon and Apec for non-imaging optics*", 2016), one can compute the absorption coefficient as:

$$\alpha = \frac{1}{d} \cdot \ln\ln\frac{P}{\tau} \text{[cm}^{-1}\text{]} \quad (12)$$

where d is the thickness of the dielectric slab (provided by manufacturer; typically varies between 1 and 4 mm).

Figure 5:
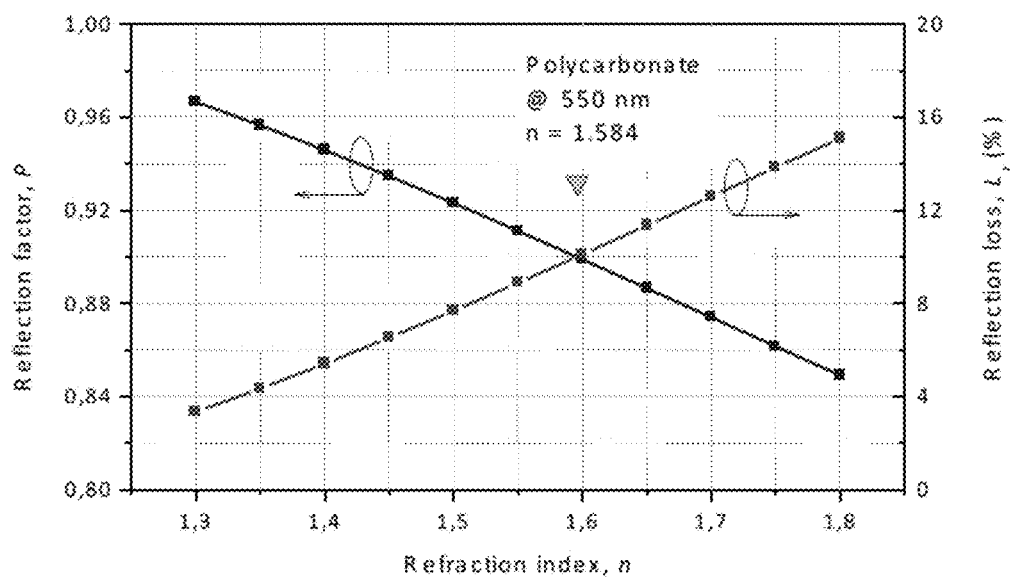

FIG. 5 presents the reflection factor P and reflection loss $L_r = (1-P)*100\%$ as a function of the bulk material refractive index. Note that refractive index of a material may strongly depend on the wavelength. As a reference value, the refractive index of Polycarbonate Macrolon OD2015 at 550 nm is provided see triangular mark in FIG. 5 for the reference index value of n=1.584, the reflection factor P=0.93, which corresponds to a reflection loss $L_r$=9.7%). Comparison with typical values of transmittance of a polycarbonate provided in COVESTRO Deutschland AG, "*Optical properties of Makrolon and Apec for non-imaging optics,*" 2016 reveals that the loss for such an optically transparent material is largely associated with reflectance (i.e. 10%), whereas the propagation loss usually does not exceed 1%.

Figure 6:
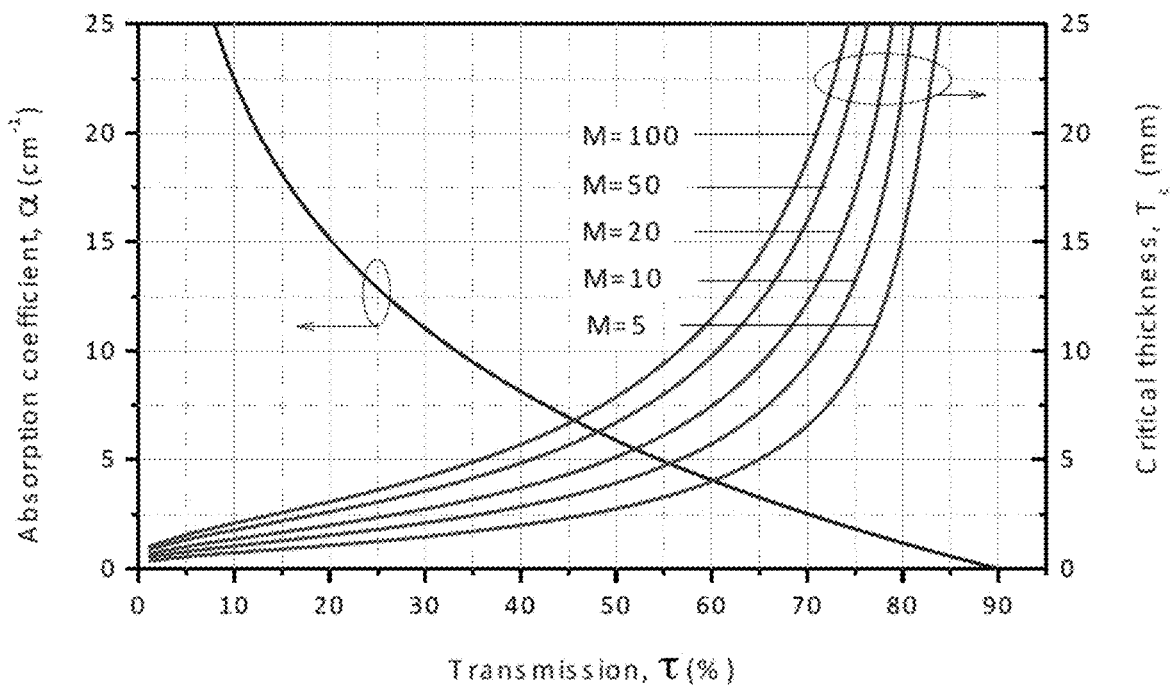

Finally, FIG. 6 presents the absorption coefficient $\alpha$ (cm$^{-1}$) and critical thickness $T_c$ [mm] of a dielectric plate as a function of the bulk material transmittance T defined in [%], whose value is typically provided in manufacturer datasheets. Here, we assume that reflection loss is equal to $L_r$=10%, which corresponds to refractive index n≈1.6 (see FIG. 5).

For optically transparent materials, like polycarbonate in the visible range, the transmittance $\tau$s close to 90%, which means that the loss is largely due to reflections rather than absorption. Thus, for the transmittance close to 90%, the absorption coefficient tends to zero. With a very low propagation loss inside the material even a small intensity magnification provided by the pillars 11 (e.g. M=5) enables one to satisfy the melting feasibility condition defined in Eqn. (7) even for a thick dielectric plate.

In case of a nearly opaque material with transmittance $\tau \le 5\%$, the feasibility condition (Eqn. 7) is reached already for a plate with a thickness of about 1 to 2 mm, which means that use of lossy materials may cause a problem with overheating of the bottom surface of the plate. This situation may occur, for instance, for a polycarbonate illuminated by a UV light with a wavelength $\lambda$<300 nm.

Thus, optimal experimental conditions may be achieved for the transmittance of the bulk material varying in between about 20 to 70%. For polycarbonate, the required transmittance can be achieved either in the UV range ($\lambda$~300-350 nm) or in the IR range ($\lambda$~1650 nm). The transmission spectrum of a material can be changed using some additives.

Note that higher propagation loss in the material (observed for lower transmittance) results in faster dissipation of the incident power and thus higher heating rates, achieved thanks to a more efficient transformation of the EM energy into the thermal one. The factors affecting efficiency of such a transformation are discussed in Section 5.4.

5.1.2 Heat Transfer Analysis

In this section, we present some considerations about the processes related to the temperature increase in the structure presented in FIG. 3A-3C. It is assumed that the heating effect is due to absorption of light in a small volume inside an unbounded medium.

According to E. J. G. Peterman et al., in "*Laser-induced heating in optical traps,*" Biophysical J., vol. 84, pp. 1308-1316, 2003, the heat per volume, Q, generated per time by transmitting a plane wave of light with intensity, I, through a medium, in the z-direction is given by $$\frac{dQ}{dt} = -\frac{dI}{dz} = \alpha I, \quad (13)$$

where $\alpha$ is the absorption coefficient defined as I (z)=I exp(-$\alpha$z).

The heat generated by the absorption will dissipate. The dissipating heat flow $J(\vec{r})$ obeys the local differential equation $$J(\vec{r}) = C \cdot \nabla(\Delta T(\vec{r})) \quad (14)$$

where C is the thermal conductivity and $\Delta T(\vec{r})$ is the temperature deviation from ambient temperature due to heating at position $\vec{r}$. In steady state the heat dissipated is equal to the heat generated:

$$\nabla J(\vec{r}) = \frac{\delta Q}{\delta t} \quad (15)$$

Using Eqs. (13) and (14), this becomes:

$$\nabla^2(\Delta T(\vec{r})) = -\frac{\alpha}{C} I(\vec{r}) \quad (16)$$

The general equation (16) shows that the local temperature increase inside a medium is proportional to the intensity of the incident light and absorption coefficient of the medium, which suggests to use a material with a highest possible absorption coefficient, allowed for by the feasibility condition Eqn. (7).

5.1.3 Control Parameters of the Method According to Embodiments of the Present Disclosure In case of zero-heat-transfer (C=0), the steady state condition (Eqn. 15) is never reached, which means that the medium can be continuously heated to any temperature (this explains the exponential increase of $T_c$ in FIG. 5 for T>90%). In practice, the maximum temperature $T_m$ to which the medium can be heated depends on the thermal conductivity of the medium and the heating rate, related to intensity of the incident wave and absorption coefficient of the medium (Eqn. 16). For slow heating (with a low intensity laser), a steady state may be reached at a temperature lower than the material melting temperature $T_m<T_{melt}$. Conversely, the use of the high-intensity laser may provoke melting of the entire layer of the material. Thus, an optimal intensity of the laser beam 14 can be defined, either numerically (e.g. using a full-wave EM/heat simulation software) or empirically in a trial-and-error experiment.

There are several parameters, which may control the method of bonding layers of materials according to embodiments of the present disclosure, among which:
- The material absorption coefficient, related to composition of the material and laser wavelength,
- Thickness of the layer, related to feasibility condition Eqn. (7) and heat flux conditions, Laser intensity and exposure time, related to melting and steady state temperatures,
- Heat transfer conditions, related to material thermal conductivity C and heat flux boundary conditions,
- NJ lens focusing ability, related to the shape and size of surface pattern features.

5.1.3.1 Absorption Coefficient

The absorption coefficient depends on the composition of the material and, more specifically, on its atomic and chemical structure. Because of this, the absorption coefficient strongly depends on the wavelength of the incident wave. Matching known dispersion characteristics of polycarbonate (PC) (see for example COVESTRO Deutschland AG, "*Optical properties of Makrolon and Apec for non-imaging optics,*" 2016) with a list of existing lasers (see for example Weber, Marvin J. «*Handbook of laser wavelengths*», CRC Press, 1999), one can select the wavelength that will provide a desired transmittance of the bulk material in the range from less than 5% observed for DUV range and up to ~90% observed for visible and NIR ranges. The transmittance/absorbance spectrum of PC can also be varied using some additives, which are typically used for coloring the bulk material.

Moreover, the absorption coefficient may also vary as a function of the EM wave intensity (non-linear effect) and material temperature: $\alpha=\alpha(I,T)$.

The former non-linear effect $\alpha=\alpha(I)$ is intrinsic to photochromic glass that changes color (i.e. becomes dark) when illuminated by a bright sun light. A photochromic-type additive to the bulk material may help further localize the heating process by increasing efficiency of the EM to thermal energy conversion directly in the focal spot of the NJ microlens.

The latter effect $\alpha=\alpha(T)$ is linked to change of the material physical properties when its temperature approaches that of the melting point.

5.1.3.2 Thickness of the Layer

Thickness of the layer can be selected rather arbitrarily, provided the feasibility condition Eqn. (7) is satisfied.

Additional considerations for selecting layer thickness may include assessment of the heat flux inside the structure, including its bottom surface and upper one with patterned microstructure. For a thick layer, it may be possible to cool down the bottom surface of layer $13_1$ to prevent its premature melting. This can be done either by air cooling (i.e. ventilation) or by a contact cooling. The latter option may be advantageous from a practical point of view. Table 1 provides typical, not specific values of the thermal conductivity and refractive index for some materials relevant to the present disclosure. As we can see, thermal conductivity of glass is about seven times higher than that of polycarbonate. Thus, one may expect to achieve a contact cooling effect for the bottom surface of Layer $13_1$ of the structure shown in FIG. 3A-3B if the structure is put on a glass substrate. However, one should kept in mind that for a very a thin layer, the contact cooling effect may cool down the entire structure also affecting heating/melting conditions at the upper surface of layer $13_1$. Thus, a minimum recommended thickness is to be defined. This value should be smaller that critical thickness defined in Eqn. (9) and also takes into account the heat flux inside the material.

The two additional advantages that can be gained using a glass substrate are the following:
- glass substrate can be used as a support and mechanical tool for pressing together the two layers of the structure in a certain phase of the heating process (e.g. after melting the top layer),
- the lower refractive index of glass will slightly reduce (~2%) the reflection loss at the air/dielectric boundary (see FIG. 6) thus increasing the EM energy penetrating inside the structure. The reflection loss can be further reduced using glass with anti-reflection coating, which could raise the transmission on the first surface up to 99%.

TABLE 1

Typical, not specific values of C and n for some materials

| Material | Thermal conductivity, C (W/(m · K)) | Refractive index, n |
|---|---|---|
| Air | 0.025 | 1 |
| Polycarbonate | 0.2 | 1.6 |
| Glass | 1.4 | 1.5 |

5.1.3.3 Laser Intensity & Exposure Time

The optimal values of the laser intensity depend on many factors, including physical properties of the bulk material (i.e. refractive index, absorption and heat transfer coefficients as well as their variation as a function of wavelength, incident wave intensity, and temperature) and the focusing ability of the NJ microlenses, defined throughout the present disclosure in terms of intensity magnification number, M. These parameters define the heating rate and maximum heating temperature corresponding to steady state. The two extreme cases are: (i) intensity is too low and steady state is observed for $T_m<T_{melt}$ and (ii) intensity is too high with entire layer melted down. The third unfavorable situation may occur for a thick layer of the material, namely melting of the bottom surface before melting microstructure elements in the contact area between the two layers $13_1$ and $13_2$.

The optimal exposure time may be found empirically after determining a correct laser intensity, which guarantees the melting condition $T_m \geq T_{melt}$.

5.1.3.4 Heat Transfer Conditions

The heat transfer conditions can be controlled by varying composition of the material, thus changing its thermal conductivity, and/or changing the thermal flux boundary conditions. The former can be done using some additives, the latter via introducing a cooling mechanism at the bottom surface of layer $13_1$.

5.1.3.5 Parameters of the Microstructure

Figure 7:
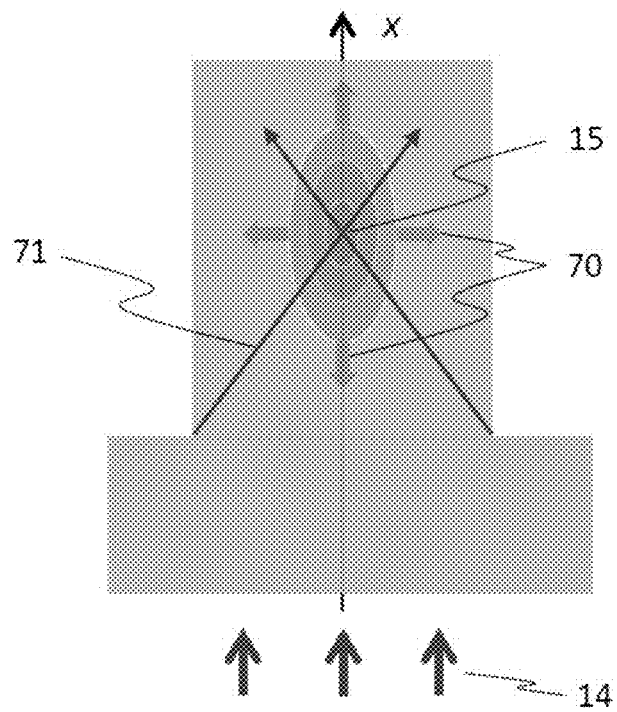

Parameters of the microscopic features at the upper patterned surface of layer $13_1$ (i.e. shape, size and spacing between the pillars 11) will define the focusing ability of each nanoscale-size bonding element and heat transfer conditions. Note that the focal spot size is always proportional to the laser wavelength, whereas the peak intensity is a function of the feature size (e.g. radius of the pillar 11). A larger size pillar 11 will cause faster heating inside the pillar 11, however, the external surface will remain colder than that of a smaller pillar 11. Thus, an optimal size of the pillar 11 is to be found as a trade-off between the EM/thermal heating in the focal spot area and thermal flux from the hot area towards periphery. This is illustrated in FIG. 7, which provides a schematic illustration for the laser heating process inside a pillar 11. The arrows illustrate the propagation directions of the EM waves 71 (i.e. so-called NJ beams originating from the edges of the pillar 11) and thermal flux direction 70, oriented outward the focal spot area 15.

The spacing between the pillars 11 may alter the thermal flux boundary condition for the pillars, thus affecting the heating rate, as well as the amount of the melted (adhesion) material available when pillars melt. The morphology and distance between the pillars can be selected in a way to provide a reliable sealing, strong enough not to break under mechanical deformations.

5.1.4 Characteristics of the Nanoscale Size Bonding Elements

The basic theory of nanojet (NJ) microlenses has been reported in PCT patent applications PCT/EP17/057130 and PCT/EP17/057131 (yet to be published at the time of filing the present patent application). These two documents show:

1. How a field intensity pattern is created in the near zone of a dielectric particle (in a free space) or a cavity (in a dielectric host medium), from incident electromagnetic waves, 2. How a focused condensed optical beam, a so-called nanojet (NJ), is created as a result of diffraction of an EM wave by a step index discontinuity associated with edges of said dielectric particle or cavity, and 3. How a high-intensity NJ beam can be created by recombination of elementary NJ beams associated with different segments of the base edge line of a dielectric particle or a cavity inside a dielectric medium.

The characteristics of NJ beams relevant to the heat-sealing method according to embodiments of the present disclosure are recalled below.

Figure 8:
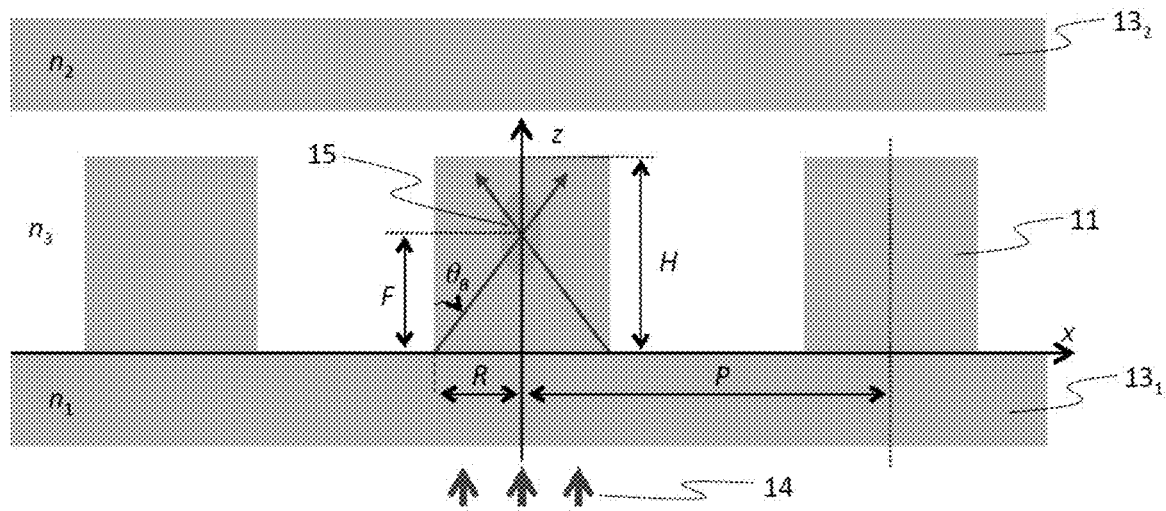

According to patent application PCT/EP17/057130, the hot spot position (i.e. focal length) with respect to the base of the pillar 11 (the base is defined with respect to the incident wave arrival direction—see FIG. 8) is predicted by the following equation:

$$F \approx R/\tan\tan(\theta_B), \quad (17)$$

where R is the radius of a circular cylindrical pillar 11 and $\theta_B$ is a nanojet radiation angle defined as:

$$\theta_B \approx \left(\frac{\pi}{2} - \theta_{TIR}\right)/2, \quad (18)$$

$$\theta_{TIR} = \sin^{-1}\left(\frac{n_3}{n_1}\right). \quad (19)$$

Here $n_1$ and $n_3$ ($n_3 < n_1$) are refractive indexes of the material and host medium (e.g. air), respectively. For simplicity, we assume here that both layers $13_1$ and $13_2$ are made of the same material ($n_1 = n_2$). Notations are given in FIG. 8.

Figure 9A:
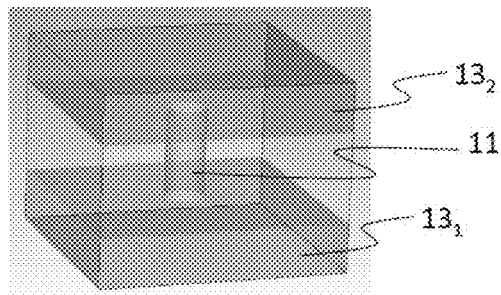
Figure 9B:
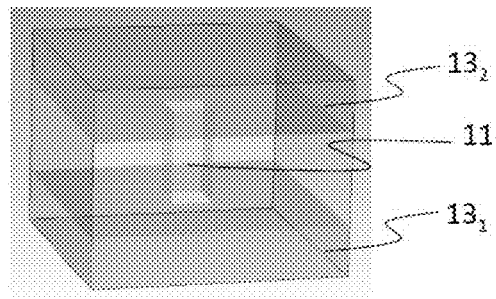

A reliable solution of the corresponding EM problem was obtained using a commercial software CST-v16, based on a 3D-FDTD full-wave EM solver. Two models were studied, namely (i) with circular cylindrical pillars and (ii) rectangular pillars, represented in FIGS. 9A and 9B, respectively. In both cases, we consider that the structure is periodic along x and y-axis. FIGS. 9A and 9B hence show a CAD model of a pillar in between two semi-infinite dielectric plates representing a unit cell of a periodic structure. FIG. 9A considers a circular pillar of radius R, while FIG. 9B considers a rectangular pillar of width $W_x = W_y = 2R$.

The top and bottom substrates are infinitely thick and made of a uniform homogeneous dielectric material with refractive index similar to the one of polycarbonate, i.e. $n_1 = n_2 = 1.58$. In this analysis, we assume that material is lossless, i.e. absorption coefficient $\alpha = 0$. Thus, our analysis are limited to the EM wave propagation and focusing phenomena, whereas no thermal effects are taken into account. Analysis is performed for three wavelength, namely $\lambda = 405$ nm, $\lambda = 532$ nm, $\lambda = 650$ nm.

The height of the pillar 11 is selected as H=2F, aiming at creating a hot spot in the middle of the pillar and thus providing a uniform heating for the entire pillar. In case of polycarbonate (n=1.58) it stands for H≈4.5R.

Figure 10A:
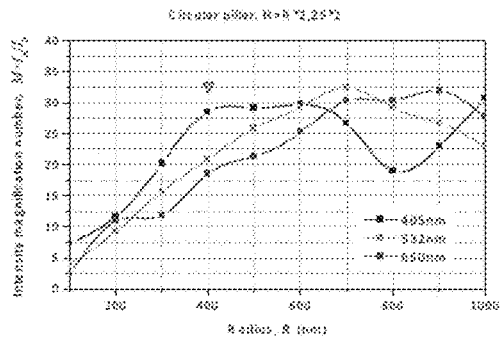
Figure 10B:
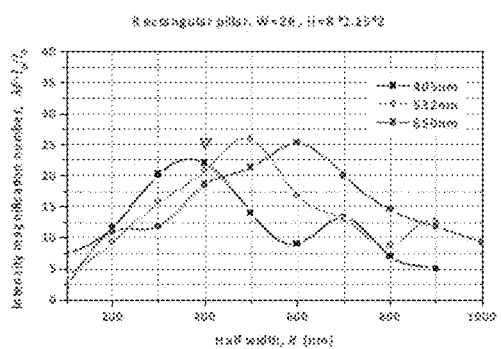

FIGS. 10A and 10B report the field intensity magnification number, defined as a ratio between the incident wave and the one propagating inside the pillar, $$M = \frac{I_m}{I_0}$$

corresponding to the first field intensity maximum inside the pillar represented as a function of the pillar size, namely radius R in case of a circular pillar (FIG. 10A) and half width R=W/2 in case of rectangular pillar (FIG. 10B). The parameters of the structure are $n_1 = 1.58$, $P_x = P_y = 5000$ nm, $W_x = W_y = 2R$, H=4.5R. The family of three curves corresponds to three different wavelengths of the incident field given in the legend. As may be observed, for all three wavelengths a maximum value of M is reached for the radius of pillar varying in between 400 and 600 nm. For the rectangular and circular pillars it varies in between 22 to 30, respectively.

Figure 11A:
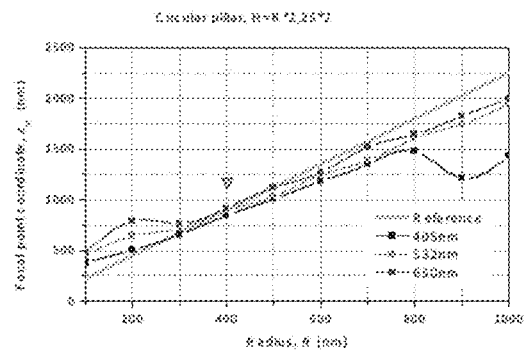
FIGS. 11A and 11B show the position of the first field intensity maximum along z-axis inside the pillar vs. pillar dimensions.
Figure 11B:
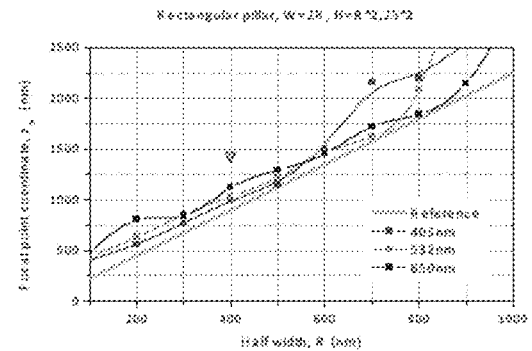

The z-coordinate of the field intensity maxima is reported in FIG. 11A-11B, which show the position of the first field intensity maximum along z-axis inside the pillar vs. pillar dimensions, respectively for a circular (FIG. 11A), and rectangular (FIG. 11B) pillar 11. Parameters of the structure are the same as in FIG. 10.

Here, the reference solution shown by grey line corresponds to Eqn. (17). A good agreement between the reference solution and the data extracted from full-wave simulations is observed for R varying in between 300 and 600 nm (i.e. about 1 to 2 wavelength in free space) which corresponds to the range, in which the NJ phenomenon is dominant. For larger dimensions, the contribution from multiple internal reflections become strongly pronounced affecting the field distribution.

Figure 12A:
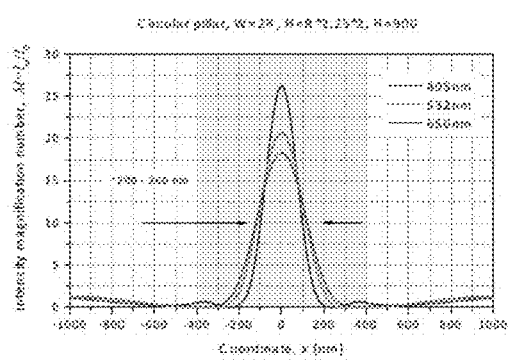
FIGS. 12A and 12B show the normalized intensity profile along x-axis, respectively for a circular pillar and for a rectangular pillar.
Figure 12B:
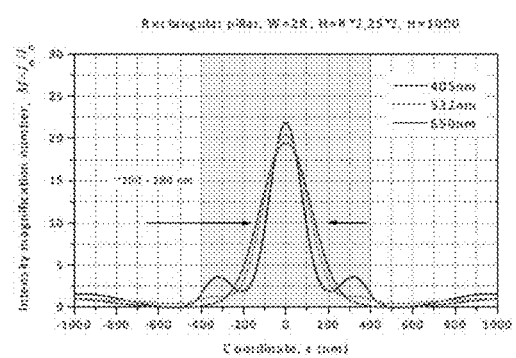

FIGS. 12A and 12B show the normalized intensity profile along x-axis, respectively for a circular pillar 11 at z=900 nm (FIG. 12A), and for a rectangular pillar 11 at z=1000 nm (FIG. 12B). Parameters of the structure are the same as in FIG. 10.

Finally, FIGS. 13 and 14 present field intensity profiles in different planes across the structure. More precisely, FIGS. 13A and 13B present the normalized field intensity patterns inside the structure with a circular pillar 11 illuminated by a plane wave from below, respectively in xz-plane (FIG. 13A), and in xy-plane, z=900 nm (FIG. 13B). FIGS. 14A and 14B present the normalized field intensity profiles inside the structure with a rectangular pillar 11 illuminated by a plane wave from below, respectively in xz-plane (FIG. 14A), and in xy-plane, z=1000 nm (FIG. 14B). Parameters of the structure are the same as in FIG. 10.

As we can see, the NJ phenomenon leads to strong localization of the field in a focal spot located on z-axis close to z=F. Maximum bonding would occur when z~F. A typical width of the spot is about 200 to 300 nm. Such a sub-wavelength focusing explains a high field intensity enhancement in the focal point.

FIG. 15A to 15F illustrate possible embodiments of the multi-layer structure used in the method according to embodiments of the present disclosure.

In one embodiment, both layers $13_1$ and $13_2$ can be made of the same dielectric material (e.g. plastic or polymer). For instance, it can be an optically-transparent plastic material, like polycarbonate, whose melting temperature is about 150° C. Polycarbonate is routinely used for CD and DVD fabrication. Polycarbonate can be easily processed via wet embossing method that allows one to create a layer of a polycarbonate material with an arbitrary surface microstructure that may comprise plurality of bonding elements having different sizes and shapes. In particular, such a microstructure may include microfluidic channels 10 as well as pillars 11 and ribs 12 acting as NJ microlenses, as shown on FIG. 15A. The use of a rib 12 is illustrated in FIG. 1A.

Figure 15:
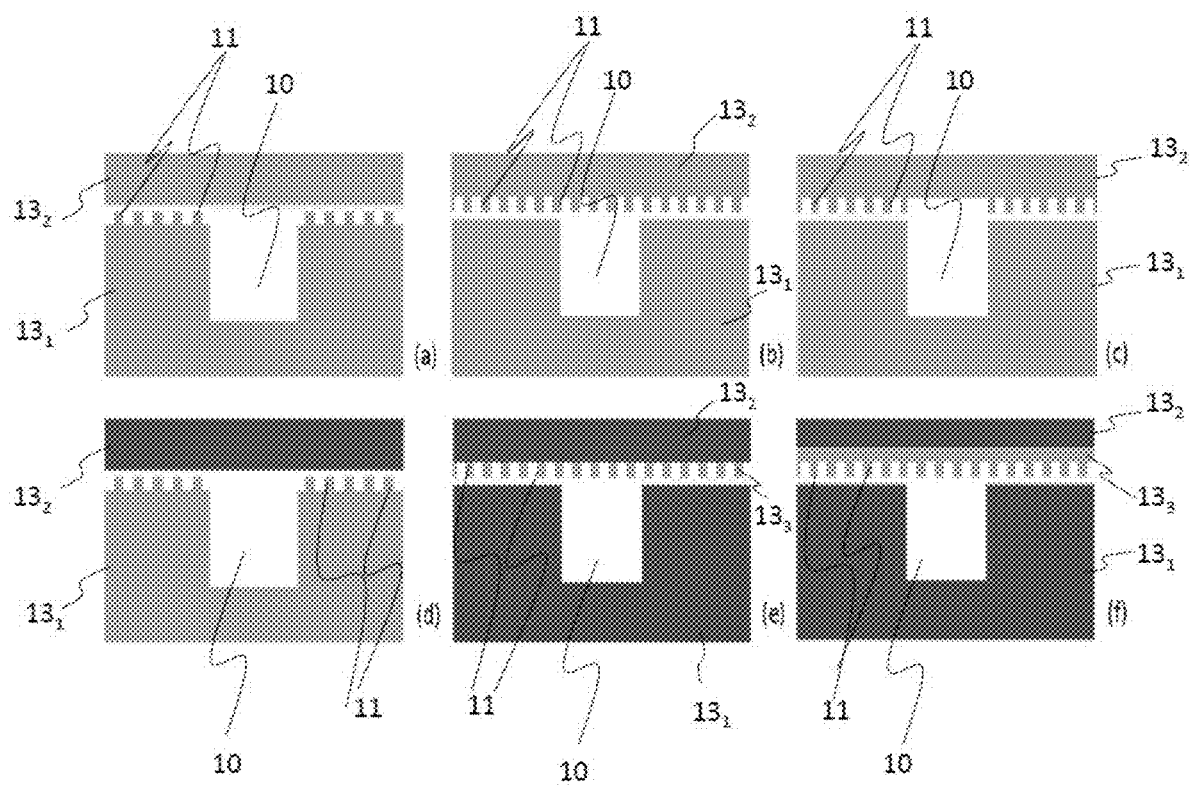

In another embodiment, the pillars 11 can be created on the surface of the second (top) layer $13_2$. They may cover either the entire surface (FIG. 15B) or only the areas that are to be in direct contact with another layer (FIG. 15C). The latter option requires a more precise alignment of both layers $13_1$ and $13_2$ at step 22 shown on FIG. 2.

In another embodiment, illustrated by FIG. 15D, the layers can be made of dissimilar materials (illustrated by different shades of grey on the picture), e.g. two different plastics or a same plastic material with different additives. In the embodiment shown on FIG. 15D, the pillars 11 are formed on the bottom layer $13_1$; however, they could as well be formed on the top layer $13_2$ as in the example of FIGS. 15B and 15C.

In yet another embodiment, a thin layer $13_3$ of a photopolymer or a thermoplastic can be deposited on a surface of layer $13_2$ made of an optically-transparent dielectric material (e.g. glass) and attached to layer $13_1$ made of another dielectric material (FIG. 15E, 15F). In the example embodiment of FIG. 15E, the thin layer $13_3$ deposited on a surface of layer $13_2$ only comprises the pillars 11, which serve as contact points between both layers $13_1$ and $13_2$ to be sealed together.

The proposed heat-sealing method according to embodiments of the present disclosure is not limited to optically transparent materials. It may actually be used at any other wavelength (e.g. THz or microwaves) and used to seal materials which may not be transparent in the optical range.

As a consequence, there is also an embodiment when layer $13_1$ and layer $13_2$ are both made of a lossy (non-transparent) material. For instance, it may be polycarbonate at a wavelength below 300 nm. In such a case, the exposure method illustrated in FIG. 1C or FIG. 3A, with a laser beam 14 passing through layer $13_1$ from below, will not work because of a high propagation loss inside the medium of layer $13_1$. Thus, the sequence of fabrication steps proposed at FIG. 2 may need to be revised. A possible alternative approach may foresee layer $13_1$ exposed by a laser beam 14 from above directly on the patterned surface until pillars 11 are melted. Then, layer $13_2$ is to be placed on top of layer $13_1$ and pressed down. In other words, step 22 must occur after step 24.

As explained in Section 5.1.4, the shape of the pillars 11 can be selected rather arbitrarily. For instance, they may have a shape of a cylinder or prism with a circular or rectangular cross-section. Other shapes are also possible including a rib-type pillar that will act as a two-dimensional (2D) nanojet microlens. In case of a rib 12, its cross-section is to be defined following the same rules as for the 3D cylindrical or pyramidal pillars 11 presented below. However, the main advantage of 3D bonding elements is in their better ability to concentrate light that results in faster heating.

The size of the bonding elements 11 must be selected with respect to the wavelength of the laser beam 14 and the desired position of the focal spot 15. In different embodiments, it may be advantageous to have a focal spot 15 inside the pillar (e.g. at half height of the pillar) or at the top tip of the pillar. The former choice results in a more uniform heating of the pillar, whereas the latter may enable simultaneous heating of a pillar 11 on bottom layer $13_1$ and its contact area of top layer $13_2$ thus potentially resulting in a better adhesion between the layers.

This will be described in greater detail in relation with an alternate embodiment below.

5.2 Alternate Embodiment

This alternate embodiment consists in choosing a particular shape of the microstructure elements (i.e. pillars) and peculiar material properties of the two layers sealed one to another. It differs from the first embodiment in that it is proposed to use the light focusing ability of the pillars to heat and locally melt the second layer, rather than the bonding elements themselves. The same pillars are used as 'hot nails' that penetrate the second layer and thus improve mechanical rigidity of the sealed structure.

Specific aspects will be described in relation to FIGS. 16 to 23. Some general features described in relation to the first embodiment however also apply to this alternate embodiment and are therefore not described again below.

Specific features of this alternate embodiment may be summarized as follows:

1. Shape of the microstructure elements (i.e. pillars) is chosen to be a cone, as illustrated in FIG. 16;
2. Dimensions of the cone are to be selected so that the focal spot appears close to the tip of the conical pillar, preferable inside layer $13_2$ right above the tip, as illustrated in FIG. 17;
3. Material of layer $13_2$ (characterized by a complex refractive index $n^*_2 = n_2 + ik_2$) must have higher losses than material of layer $13_2$ (characterized by a complex refractive index $n^*_1 = n_1 + ik_1$), namely $k_2 > k_1$, where $k_1$ and $k_2$ are extinction coefficients of the material of layer $13_1$ and layer $13_2$, respectively.

FIG. 16 illustrates the geometry and notations of a conical pillar on a surface of a dielectric substrate. The bonding element, or pillar 11, is a truncated cone with base radius $R_1$, top radius $R_2$, height H, and base angle α. It is formed on the surface of a layer $13_1$ with complex refractive index $n^*_1$. On FIG. 16, the incident electromagnetic wave comes from below, and its direction is orthogonal to the bottom of layer $13_1$. The crossing arrows illustrate the propagation directions of the EM waves 71 (i.e. so-called NJ beams originating from the base edges of the cone 11, forming an angle 9 with the direction of the EM incident wave). The NJ beams cross each other at height F, close to, but above, the tip of the cone 11. F corresponds to the focal length of NJ microlens formed by the cone 11. This is also illustrated in FIG. 17, which provides a schematic illustration for the laser heating process above the pillar 11. The arrows illustrate the propagation directions of the EM waves 71 (i.e. so-called NJ beams originating from the edges of the pillar 11) and thermal flux direction 70, oriented outward the focal spot area 15.

More precisely, FIG. 17 (a) provides a schematic drawing of the EM wave focusing and local heating phenomena in a structure comprising at least one conical pillar 11 on a surface of layer $13_1$ illuminated by an EM wave from below; FIG. 17 (b) illustrates the power loss density distribution for the same structure illuminated by a plane wave from below; FIG. 17 (c) provides a heat map inside the structure at a certain time moment.

5.2.1 Design Guidelines

Focal spot size of a nanojet microlens is about one half of the wavelength in the medium. Thus, it may be beneficial to create a cone 11 with a tip of the same radius, i.e.

$$R_2 \approx \frac{\lambda_0}{n_1}.$$

This will guarantee uniform heating of the tip. It is known from the prior art that intensity of the NJ beam is proportional to the length of the base edge line, $L=2\pi R_1$. Increasing the radius of the cone base may be used to enhance intensity of the NJ beam and, thus, provide a faster heating of the material in the vicinity of the NJ focal spot. Recommended value of the base radius is about one and a few wavelengths in the cone material. The focal length of a conical NJ microlens can be estimated as $$F \approx \frac{R_1}{\tan\tan(\theta)} \quad (20)$$

where $\theta$ is the NJ deviation angle for a step having base angle $\alpha<90°$.

According to patent document PCT/EP17/057131, it can be derived as:

$$\theta \approx \theta_B + (90° - \alpha)/3 \quad (21)$$

where $\theta_B \approx \left(\frac{\pi}{2} - \theta_{TIR}\right)/2,$ where $\theta_{TIR}=\sin^{-1}(n_3/n_1)$ is the critical angle for a diopter with indices $n_1$ and $n_3$ ($n_1>n_3$), $n_3$ being refractive index of the host medium. This empiric equation is valid at least for $\alpha=90°\pm30°$.

Recommended height of the conical pillar 11 is equal (or slightly smaller) than focal length:

$$H \approx F \quad (22)$$

Preferably, it should also be larger that at least one half of the wavelength in the cone material. The base angle can be selected rather arbitrarily (e.g. in the interval 45 to 90 degree).

5.2.2 Materials and Methods

To enable the desired performance, layer $13_1$ and NJ microstructures on its surface should preferably be fabricated of a low-loss material (at the wavelength of the incident EM wave), whereas layer $13_2$ should have losses higher than that of layer $13_1$ (i.e. $k_2>k_1$, where $k_i$ is the extinction coefficient of the corresponding material).

A higher loss in the material of layer $13_2$ will result in a stronger absorption of the EM radiation in layer $13_2$ that will be heated and melted right above the pillars 11 acting as light focusing elements. Note that, unlike in the first embodiment of Section 5.1, the pillars 11 themselves will not melt but instead will act as a kind of 'hot nails' that will finally penetrate into the melted material of layer $13_2$. Depending on the choice of materials for layers $13_1$ and $13_2$ (and especially depending on their melting temperature) the pillars can melt, at least partly, after penetration into the upper layer $13_2$.

Like in the first embodiment, this alternate embodiment offers an adhesive-free heat sealing method that can be applied to join two similar or dissimilar materials under exposure of a non-ionizing electromagnetic (EM) radiation, e.g. a laser beam.

Unlike other heat sealing methods, this method does not require any thermosoftening glue, resin, or another adhesive material to be added. Instead, it relies on a controlled highly-localized heating of a superficial layer of the bulk material. This offers a strong advantage in scenarios when materials that need to be sealed together already have some microscale surface patterns, which must be kept clean from any impurities, like in case of a microfluidic chip, as illustrated in FIG. 18, described in greater detail below.

5.23 Operational Principle

Figures 18A, 18B:
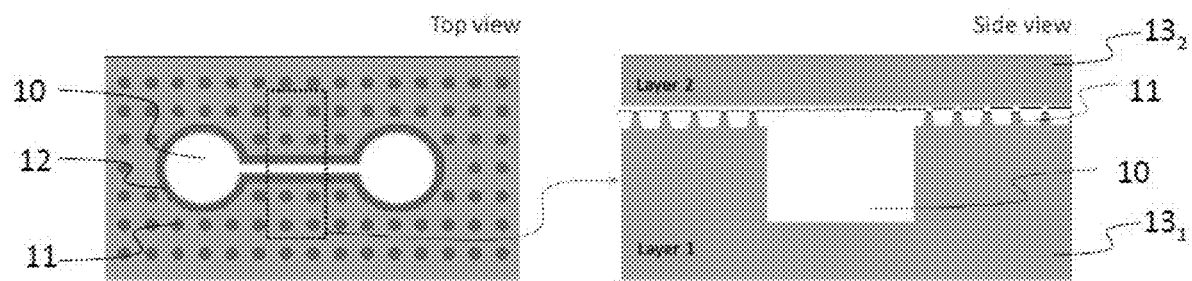

FIG. 18A provides a top view of a microfluidic structure comprising one microfluidic channel 10 and a plurality of pillars in a form of truncated cones 11 and ribs 12 created on a surface of a layer $13_1$. FIG. 18B shows a side view of the structure corresponding to a cross-section highlighted by a dashed line on FIG. 18A.

When illuminated by an incident EM wave (e.g. laser beam) as shown in FIG. 17, each element of the micropattern on the surface of layer $13_1$ (having a form of a pillar or rib) acts as a microlens creating a condensed optical beam (so-called nanojet) at a certain distance from the base of the pillar. According to the prior art, the focal length of a cylindrical NJ microlens is determined by the pillar shape, size, and refraction index of its material. In case of a conical pillar it can be predicted by Eqn. (19) above. The idea of the proposed method is to design the NJ elements so that the focal spot is created right above the tip of the pillar (attached to layer $13_1$) but inside layer $13_2$ that is to be put in a direct contact with layer $13_1$.

Under certain conditions, which may include adequate selection of materials of both layers, correct design of the NJ focusing elements, and certain exposure conditions, a highly-localized heating can be provided right above the tips of the pillars 11 resulting in melting (or softening) of layer $13_2$. A light pressure can be applied to press the layers one to another so that NJ elements of layer $13_1$ penetrate into the melted (softened) material of layer $13_2$. After cooling, a strong bond will be created along the contact line.

The proposed method can be used for sealing various thermoplastic materials, such as ABS, PLA, PMMA, PTFE, Polycarbonate, COC, etc.

In one embodiment, the loss in the material used for layer $13_2$ can be modified (i.e. increased) using a chemical additive (e.g. of a photochromic type, carbon black, absorptive dyes or pigments) added to the same bulk material, e.g. polycarbonate, like previously described in relation to the first embodiment.

Note that some polymer materials, like PC, does not have a melting point in the true sense of this term. Instead, it has a glass transition temperature at which material transitions from glass to rubber. When reaching this glass transition temperature, the material becomes soft and flexible. For instance, in case of polycarbonate (PC), the glass transition temperature is about 147° C., whereas the temperature at which it can be used for injection molding is about 230 to 300° C. The sealing of the two layers of polycarbonate is possible at temperatures between 150° C. and 230° C. At higher temperatures, it will become liquid and may fill in and block microchannels.

In one embodiment, main steps of the proposed method can be the following (note that they only slightly differ from the embodiment of FIG. 2, as already mentioned):

Layer 13$_1$ is created using an established microfabrication method (e.g. injection molding, wet embossing, nano-imprint, or UV/DUV direct write) in a form of a substrate with a micropattern on its top surface. The pattern may include at least one (usually much more) NJ focusing element(s) 11 having cylindrical or conical shape. In case of a need for multiple sealing points, a plurality of uniformly (or non-uniformly) distributed pillars can be created (step 21 of FIG. 2).

Layer 13$_2$ is created in a form of a substrate with a smooth surface.

The two layers are put in direct contact so that the microstructure occurs along the contact surface and aligned according to the intended use (step 22 of FIG. 2)

The structure is put under light pressure, e.g. being pressed in between two plates, e.g. a first plate made of glass or quartz, acting as a support of layer 13$_1$, and a second plate made of a glass or plastic, put on top of layer 13$_2$ and as a press.

The structure is illuminated from below as shown in FIG. 18 with a laser beam with a certain wavelength and exposure parameters (e.g. intensity and pulse duration) (step 23 of FIG. 2).

The structure is left under pressure until hardening occurs (usually as it cools down) (step 25 of FIG. 2).

Note that

Materials of the layers are to be selected so that $k_2 > k_1$, where $k_1$ and $k_2$ are extinction coefficients of the material of layer 13$_1$ and layer 13$_2$, respectively.

Preferably, $k_1$ should be as small as possible (e.g. $k_1 < 10^{-5}$) so that most of the power loss occurs in layer 13$_2$. In one embodiment, both layers can be fabricated from the same bulk material (e.g. PC) with some additives used for layer 13$_2$.

Wavelength of the laser is to be selected with respect to the absorption spectra of the materials in order to achieve desired values of the extinction coefficients for material of layer 13$_2$ and 13$_2$.

Shape and size of the NJ focusing elements 11 are to be defined with respect to the wavelength of the incident EM wave and refractive index of the materials so that the focal spot appears above the tip of the pillar inside layer 13$_2$.

Note that unlike the first embodiment, thickness of the layers can be selected arbitrarily. This is because the loss (and thus heating) will largely occur in a superficial layer of layer 13$_2$ in the vicinity of the focal spots created by NJ focusing elements 11.

5.2.4 Simulation Data

FIGS. 19 to 23 report simulated data describing the impact of the pillar shape and material losses on the focusing ability of the pillars and the temperature patterns inside the structure.

Figure 19:
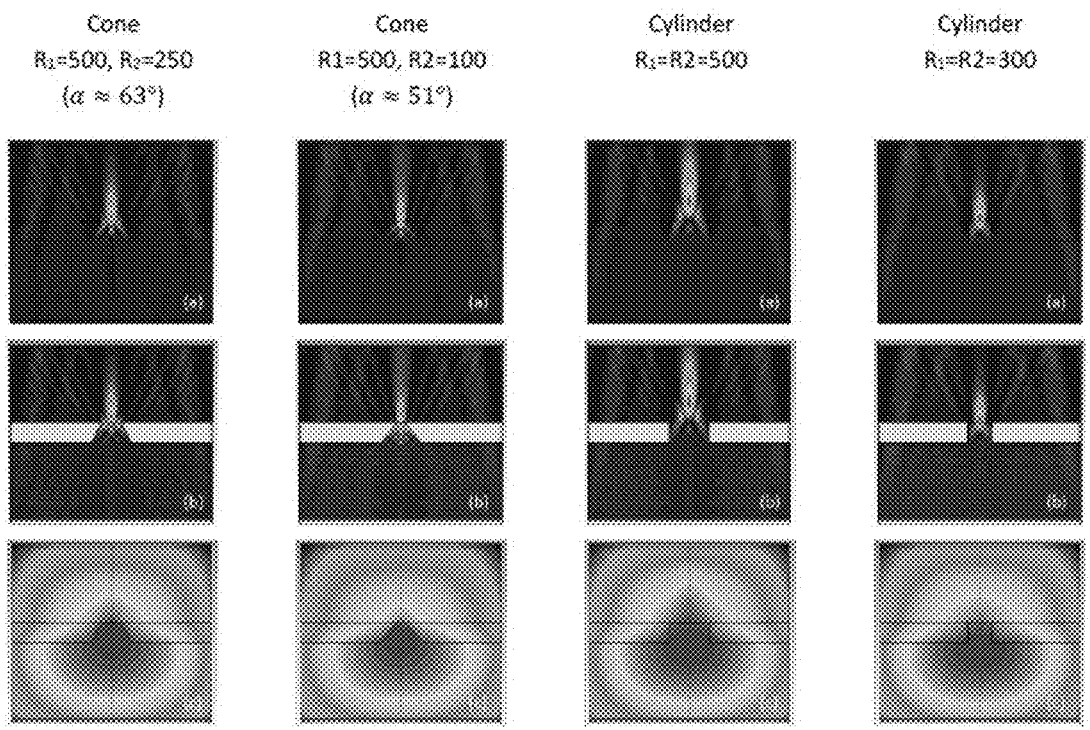
Figure 20:
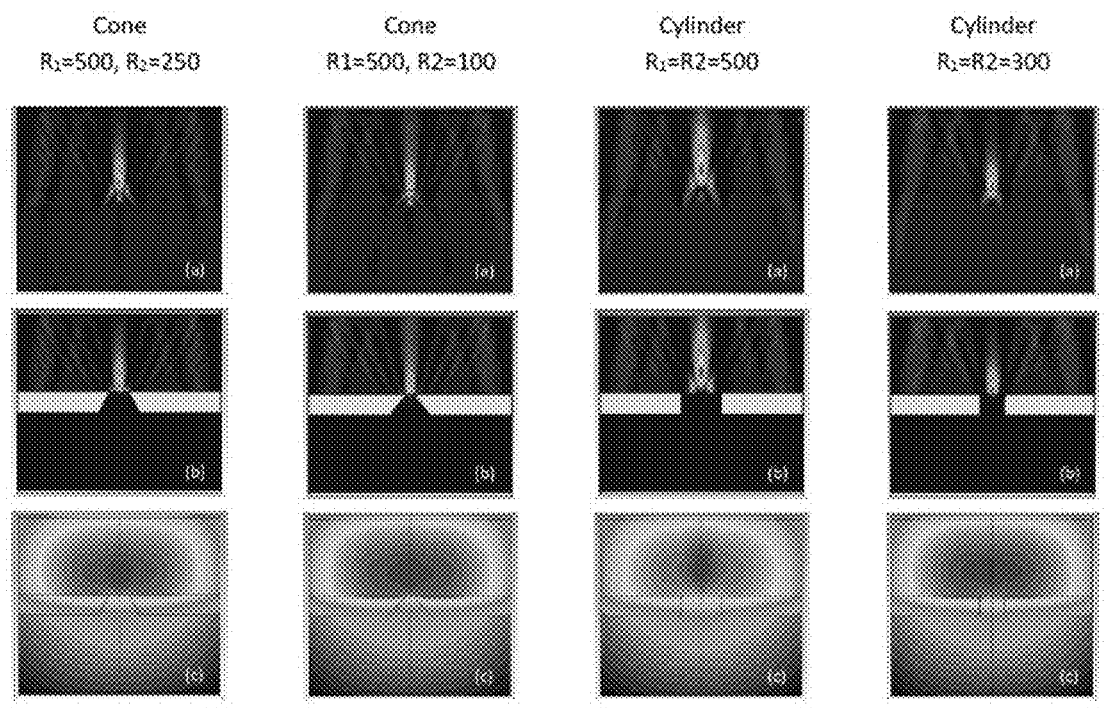
Figure 21:
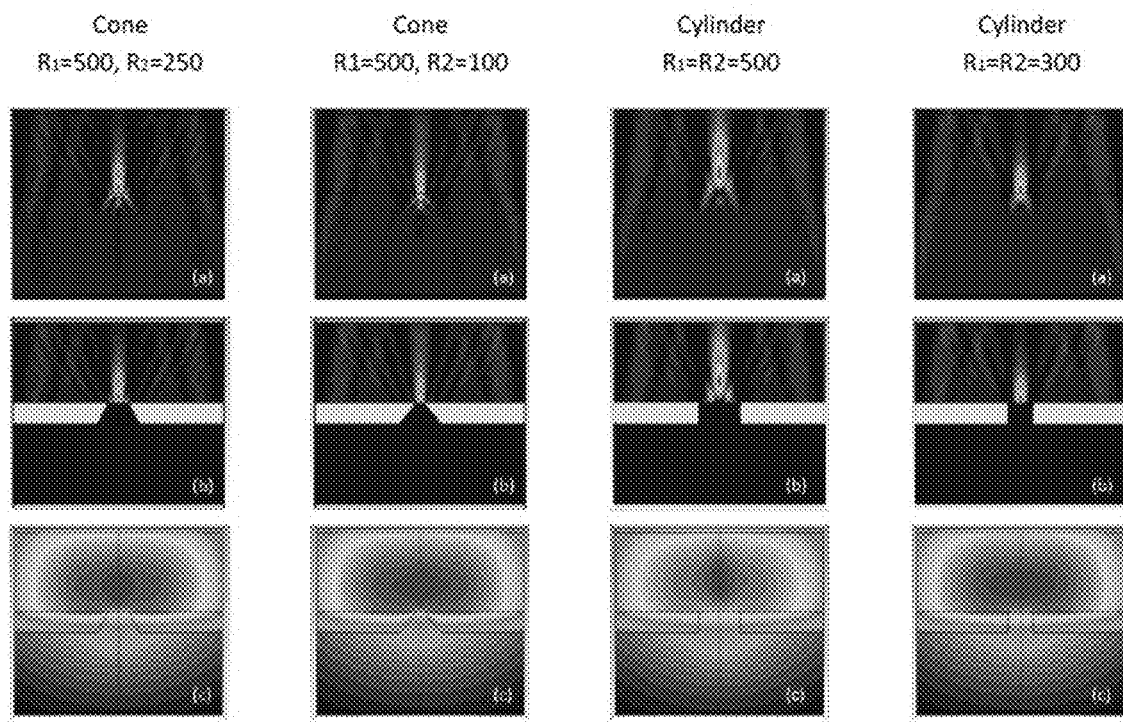

FIGS. 19-21 present normalized field intensity (top), power loss (middle), and temperature (bottom) patterns for conical and cylindrical pillars having different radii and base angles for three different values of $k_2$ (i.e. extinction coefficient describing the loss in layer 13$_2$). The data are obtained for structures illuminated by a plane wave from below, with features=405 nm, H=500 nm, $n_1=n_2=1.58$, $k_1=10^{-5}$, $k_2=10^{-5}$. More precisely, FIG. 19A corresponds to cone pillars 11 with base radius $R_1=500$ nm and top radius $R_2=250$ nm, and base angle $\alpha \approx 63°$; FIG. 19B corresponds to cone pillars 11 with base radius $R_1=500$ nm and top radius $R_2=100$ nm, and base angle $\alpha \approx 51°$; FIG. 19C corresponds to cylindrical pillars 11 with radius $R_1=R_2=500$ nm and FIG. 19D corresponds to cylindrical pillars 11 with radius $R_1=R_2=300$ nm.

FIG. 20A-20D only differ from FIG. 19A-19D in that $k_2=10^{-4}$, all the other features remain unchanged; FIG. 21A-21D only differ from FIG. 19A-19D in that $k_2=10^{-3}$, all the other features remain unchanged.

Figure 22:
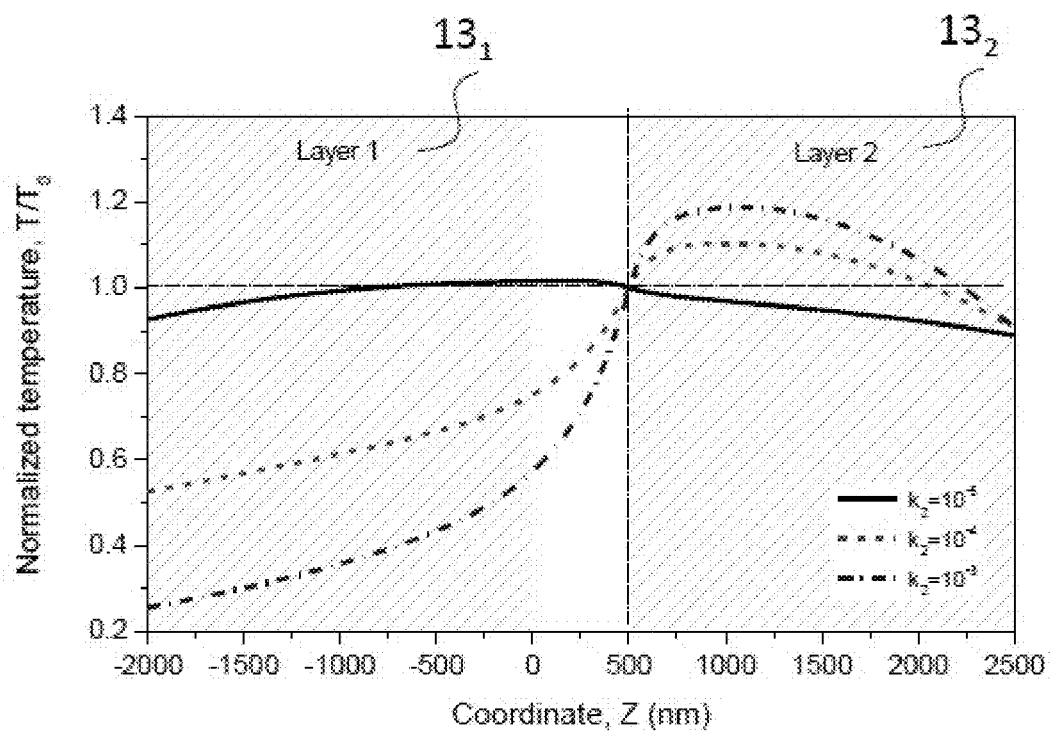

FIG. 22 provides temperature profiles along the axis of the pillars, for different shapes of the pillars, extracted from temperature patterns reported in FIGS. 19-21.

Figure 23A:
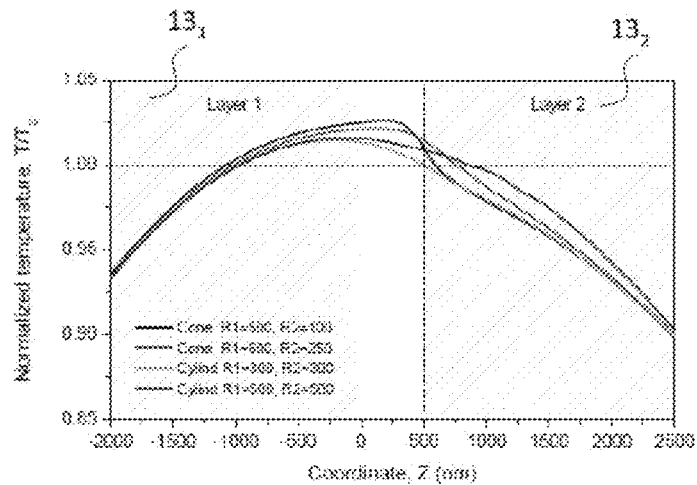
Figure 23B:
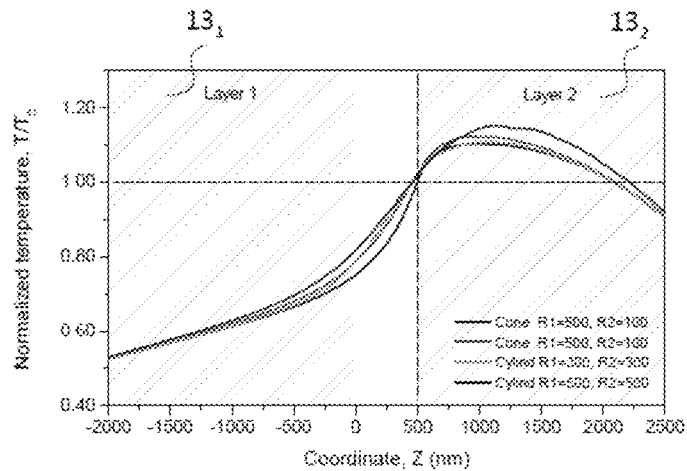
Figure 23C:
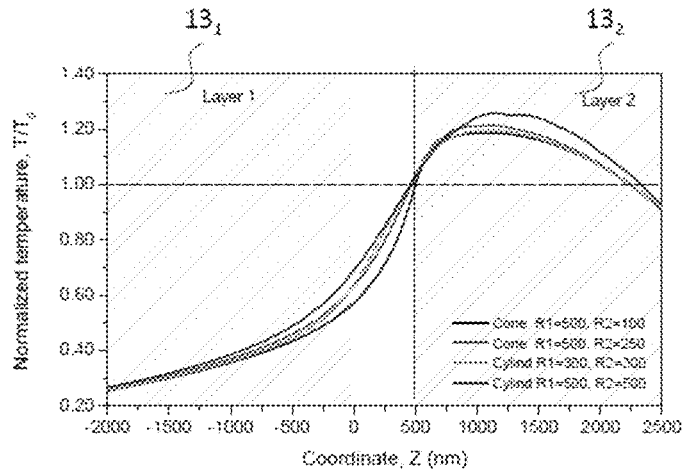
Figure 32A:
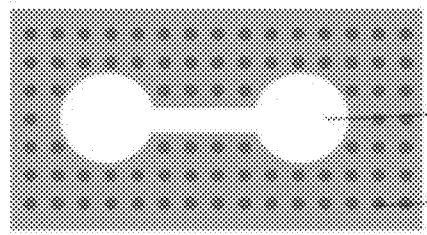
Figure 32C:
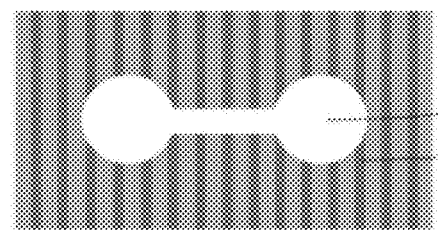
Figure 32B:
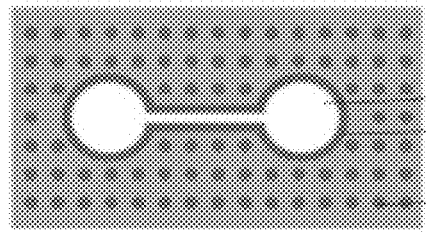
Figure 32D:
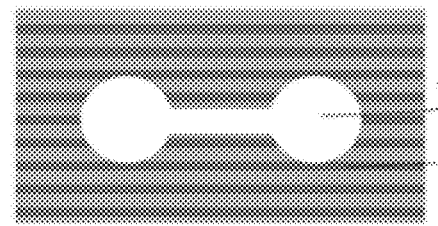

FIG. 23 provides temperature profiles for the conical pillar for three different values of k2.

From FIG. 19a, variation of the base radius $R_1$ and base angle $\alpha$ enables one to vary position and dimensions of the focal spot. In case of low-loss materials ($k_1=k_2=10^5$), the power loss, and thus heating, occurs in the vicinity of the pillar both in layer 13$_1$ and layer 13$_2$ (FIGS. 19b, 19c).

In case when layer 13$_2$ is made of a material with higher losses (FIGS. 20, 21), the power loss and heating occurs in layer 13$_2$ right above the tip of the pillars 11, which is the preferable scenario.

Comparison of the temperature profiles reported in FIG. 22, reveals that the use of a conical pillar with a sharp tip helps to achieve a larger temperature gradient at the interface of the layers, which may be beneficial for achieving a highly-localized heating and melting of layer 13$_2$ without overheating of the pillar itself.

As shown in FIG. 23, the temperature gradient can be further enlarged by increasing the loss in the material of layer 13$_2$.

This alternate embodiment, as compared to the first one described in Section 5.1, is advantageous in that it is not as demanding as regards precise calibration for the laser power and exposure conditions. In the first embodiment, erroneous exposure conditions may result in premature melting of the entire layer (or its bottom surface) instead of the microstructure elements. Such a drawback is avoided thanks to the alternate embodiment of Section 5.2.

As compared to the first embodiment, this alternate embodiment is simplified in the aspects related to (a) fabrication of the microstructure of bonding elements and (b) calibration of the exposure conditions. Moreover, the method is more versatile and more easily applicable for sealing of different materials. It also enhances mechanical rigidity of the sealed structure.

5.3 Comparison of the Focusing Ability of Cylindrical Shape Bonding Elements and Conical Shape Bonding Elements.

FIG. 24A illustrates an overall view of the topology for a NJ comprising plurality of cylindrical pillars. FIG. 24B presents near field intensity pattern computed using 3D-FDTD method for a single pillar in a periodic arrangement illuminated by a plane wave incident from below, and FIG. 24C presents notations for a NJ comprising plurality of cylindrical pillars. Parameters of the pillars and incident wave: height H=3000 nm, radius R1=R2=500 nm, pitch P=3000 nm, material polycarbonate, laser wavelength=2000 nm.

FIGS. 25A, B and C are the same as FIGS. 24A, B and C respectively for conical pillars with dimensions: height H=3000 nm, radius R1=800 nm, R2=400 nm, pitch P=3000 nm.

FIG. 26 represents field intensity distribution along the axis of the cylindrical (H=P=3000 nm, R1=R2=500 nm) and conical pillars (H=P=3000 nm, R1=800 nm, R2=400 nm) normalized by intensity of a plane wave with wavelength of 2000 nm propagating in the positive z direction in unbounded medium with the same refractive index. Parameters of the structure are the same as in FIG. 24B and FIG. 25B, respectively.

FIG. 27A represents power density enhancement in a cross-section of the pillar (cut plane z=H) computed with respect to the incident plane wave propagating in the same unbounded medium and FIG. 27B represents coupling efficiency of the pillar computed as a ratio of the power guided through the pillar and that incident on the surface of the unit cell of the NJ comprising this pillar.

NJ laser welding method is based on local heating of the pillar and its surrounding. Thus, it is advantageous to have the maximum power density enhancement (PDE) inside the pillar compared to the power density of the EM wave propagating through the cover layer, whose thickness is large enough to be considered as unbounded medium. The power density enhancement in the pillar leads to premature heating of the pillar and faster temperature rise in its vicinity compared to the uniform medium. As one may see in FIG. 27A, the maximum PDE is achieved for a pillar diameter close to one half of the laser wavelength, which corresponds to the coupling efficiency of about 60%.

FIG. 28 represents the light focusing ability of a conical pillar versus its tip radius. The family of four curves corresponds to different base radii. The maximum PDE is achieved for tip radius of about 400 to 500 nm. The higher absolute value of PDE in case of a conical pillar compared to the cylindrical one is explained by its larger base that provides a larger effective aperture.

FIG. 29 represents PDE of the cylindrical and conical pillars versus height of the pillar. The dimensions are selected according to FIG. 28. As one may see, for cylindrical pillar PDE grows monotonically with increase of height, whereas PDE of a conical pillar demonstrates a maximum around H=3500 nm. Thus, if height of the pillars is limited for a certain practical reason (e.g. H≤1.5λ), it might be beneficial to use conical pillars providing a higher PDE with a smaller height. Whereas the use of cylindrical pillars may be beneficial when its height can be increases beyond H≥1.5λ.

FIG. 30 represents PDE of the cylindrical and conical pillars versus pitch of the periodic array of pillars. The pitch size of about 1.5λ is optimal for both types of pillars with the selected height and radii and given illumination conditions.

FIG. 31A-D represents results of the EM and thermal analysis of the NJ texture at the interface between two layers of cylindrical pillars (H=P=3000 nm, R1=R2=500 nm) illuminated by a plane wave (λ=2000 nm) propagating in the positive z direction. The NJ texture is at the interface of two 150 μm-thick layers of a polycarbonate material. FIG. 31A represents power density and loss distribution in x-z cross-section of the pillar. FIG. 31B represents temperature rise profile in the cross-section of the pillar in the vicinity of the texture at different time intervals. The color scale corresponds to the temperature rise with respect to the initial temperature, ΔT=T−T0. At each time interval, the temperature profile is normalized by its maximum, with the color scale defined so that color referenced under numeral 310 corresponds to the maximum temperature rise and the color referenced under numeral 311 corresponding to 80% of the max. FIG. 31C represents temperature profile along z-axis at time t=0.1 milliseconds. The temperature rise corresponds to a reference laser power and focal spot size. FIG. 31D represents temperature profile along z-axis for different time moments. The corresponding temperature profiles in the vicinity of the NJ texture are illustrated in FIG. 31B.

As one may see in FIG. 31, in the initial moment after a time period of 1 ms, the temperature profile resembles well the power and loss profiles. However, the local heating effect is not preserved in time due to the heat transfer. Thus, it may be beneficial to use a pulsed laser, with pulse duration order of 1 ms or even shorter and a relatively-high peak power sufficient to melt the bonding elements with a single pulse or a short sequence of pulses with at least partly-overlapping focal spots.

FIG. 32A-D represents different embodiments of the NJ texture with pillar-type and rib-type bonding elements surrounding a microfluidic channel provided on a surface of a cover or base layers. These bonding elements are in a form of FIG. 32A pillars, FIG. 32B pillars and a rib aligned with the microfluidic channel, FIG. 32C ribs aligned orthogonal to the channel, FIG. 32D ribs aligned parallel to the microfluidic channel. Bonding elements.

Figure 33A:
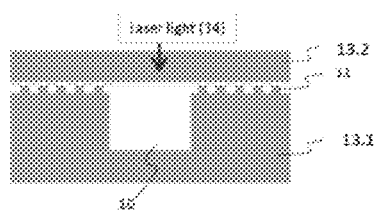
Figure 33B:
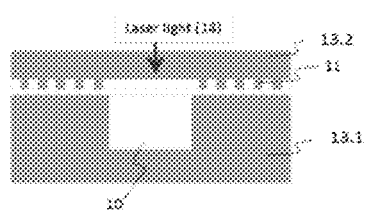
Figure 33C:
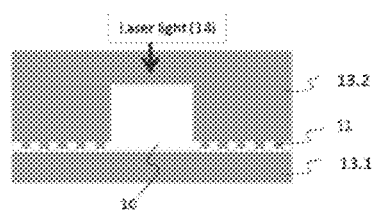
Figure 33D:
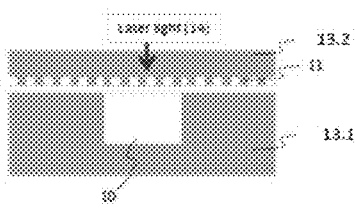
Figure 33E:
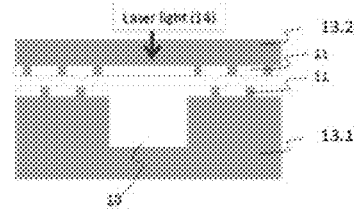
Figure 33F:
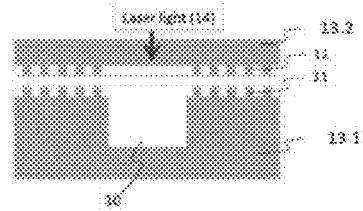

FIG. 33A-F represents different embodiments of the methods with NJ texture and microfluidic channel provided on the same or different parts. In FIG. 33A, texture and microfluidic channel are on the base layer; in FIG. 33B texture is on the cover layer and microfluidic channel on the bottom layer; in FIG. 33C both texture and microfluidic channel are on the cover layer; in FIG. 33D texture covers the entire surface of the cover layer; in FIG. 33E texture is on both layers with the NJ pillars interlaced; mast, in FIG. 33F texture is on both layers with the NJ pillars superimposed.

The invention claimed is:

1. A method of bonding layers of dielectric materials, comprising:
providing a surface of at least one of said layers with microscale size and/or nanoscale-size bonding elements forming contact points of said layers, the microscale-size and/or nanoscale-size bonding elements having a length in a direction perpendicular to the surface of less than 5000 nanometers;
bringing said layers into a mutual position according to an intended use;
illuminating a first layer of said layers whose surface is provided with bonding elements by an incident electromagnetic wave, the propagation direction of which forms an angle comprised between 70° and 110° with said first layer, and whose wavelength is selected depending on an absorption spectrum of at least one of materials forming said layers;
generating, as a result of the illumination, condensed optical beams within said bonding elements or close to a tip of said bonding elements, the tip making contact with a second layer of said layers;

heating and melting said bonding elements and/or said second layer by high-intensity focal spots formed by said generated optical beams;

maintaining said layers in the mutual position until bonding of said layers.

2. The method of claim 1, wherein said bonding elements form a patterned microstructure on the surface of said first layer.

3. The method of claim 1, wherein said bonding elements have a form of pillars and/or ribs.

4. The method of claim 1, wherein a dimension of said bonding elements in the direction of said incident electromagnetic wave is targeted to be between half a wavelength of said incident electromagnetic wave and a few wavelengths of said incident electromagnetic wave.

5. The method of claim 1, wherein said layers are made of the same material.

6. The method of claim 1, wherein said layers are made of distinct materials.

7. The method of claim 1, wherein a material of said first layer which surface is provided with bonding elements belongs to the group comprising plastics and thermoplastics.

8. The method of claim 7, wherein a material of at least one of said layers comprises absorptive dyes or pigments.

9. The method of claim 1, wherein it also comprises providing a surface of at least one of said layers with engraved microfluidic channels.

10. The method of claim 1, wherein bringing said layers into a mutual position according to an intended use is performed after heating and melting (34) said bonding members.

11. The method of claim 1, wherein, when bringing said layers into a mutual position according to an intended use, said layers are placed into direct contact between two optically transparent plates.

12. The method of claim 1, wherein it also comprises cooling down a surface of said first layer opposite to said surface provided with said bonding elements.

13. The method of claim 1, wherein it also comprises pre-heating at least said surface provided with said bonding elements.

14. The method of claim 1, wherein providing a surface of at least one of said layers with microscale and/or nanoscale-size bonding elements is performed by molding or wet embossing said surface.

15. The method claim 1, wherein said bonding elements have a conical shape, wherein their dimensions are selected so that the condensed optical beams are generated close to but above the tip of said bonding elements intended to be in contact with the other layer, and wherein said layer whose surface is provided with bonding elements is made of a material which has lower losses and/or a higher melting temperature than a material of the other layer.

* * * * *